(12) United States Patent
Baliga

(10) Patent No.: US 6,784,486 B2
(45) Date of Patent: Aug. 31, 2004

(54) VERTICAL POWER DEVICES HAVING RETROGRADED-DOPED TRANSITION REGIONS THEREIN

(75) Inventor: Bantval Jayant Baliga, Raleigh, NC (US)

(73) Assignee: Silicon Semiconductor Corporation, Research Triangle Park, NC (US)

( * ) Notice: Subject to any disclaimer, the term of this patent is extended or adjusted under 35 U.S.C. 154(b) by 51 days.

(21) Appl. No.: 10/199,583

(22) Filed: Jul. 19, 2002

(65) Prior Publication Data

US 2002/0185679 A1 Dec. 12, 2002

Related U.S. Application Data

(63) Continuation-in-part of application No. 09/602,414, filed on Jun. 23, 2000, now Pat. No. 6,545,316, and a continuation of application No. 09/833,132, filed on Apr. 11, 2001.

(51) Int. Cl.[7] .......................... H01L 29/76; H01L 23/58
(52) U.S. Cl. ...................... 257/327; 257/328; 257/329; 257/341; 257/345; 257/492; 257/493
(58) Field of Search ................................ 257/327–329, 257/341–345, 491–493, 496

(56) References Cited

U.S. PATENT DOCUMENTS

| | | | |
|---|---|---|---|
| 4,376,286 A | 3/1983 | Lidow et al. | 357/23 |
| 4,419,811 A | 12/1983 | Rice | 29/571 |
| 4,590,509 A | 5/1986 | Esser et al. | 357/53 |
| 4,593,302 A | 6/1986 | Lidow et al. | 357/23.4 |
| 4,642,666 A | 2/1987 | Lidow | 357/23.4 |

(List continued on next page.)

FOREIGN PATENT DOCUMENTS

| | | | |
|---|---|---|---|
| DE | 195 34 154 A1 | 3/1997 | ......... H01L/29/808 |
| JP | 63-296282 | 2/1988 | |
| JP | 93132077 | 5/1991 | |
| WO | WO 99/56311 | 11/1999 | |
| WO | WO 00/44031 | 7/2000 | |

OTHER PUBLICATIONS

International Search Report, PCT/US02/12775, Apr. 4, 2003.
Merchant et al., "Dependence of Breakdown Voltage on Drift Length and Buried Oxide Thickness in SOI RESURF LDMOS Transistors," 5th International Symposium on Power Semiconductor Devices and Ics, 1993 IEEE, pp. 124–128.
Merchant et al., "Realization of High Breakdown Voltage (> 700 V) in This SOI Devices," Philips Laboratories, North American Philips Corporation, 1991 IEEE, pp. 31–35.
Sunkavalli et al., "Step Drift Doping Profile for High Voltage DI Lateral Power Devices," Proceedings 1995 IEEE International SOI Conference, Oct. 1995, pp. 139–140.
Yamaguchi, Ken, "Field–Dependent Mobility Model for Two–Dimensional Numerical Analysis of MOSFET's," IEEE Transactions on Electron Devices, vol. ED–26, No. 7, Jul. 1979, pp. 1068–1074.
Baliga, B. Jayant, "Power Semiconductor Devices," PWS Publishing Co., ISBN 0–534–04098–6, 1995, pp. 335–425.

Primary Examiner—Minh-Loan Tran
(74) Attorney, Agent, or Firm—Myers Bigel Sibley & Sajovec

(57) ABSTRACT

Power MOSFET devices provide highly linear transfer characteristics (e.g., $I_d$ v. $V_g$) and can be used effectively in linear power amplifiers. These linear transfer characteristics are provided by a device having a channel that operates in a linear mode and a drift region that simultaneously supports large voltages and operates in a current saturation mode. A relatively highly doped transition region is provided between the channel region and the drift region. Upon depletion, this transition region provides a potential barrier that supports simultaneous linear and current saturation modes of operation. Highly doped shielding regions may also be provided that contribute to depletion of the transition region.

11 Claims, 32 Drawing Sheets

U.S. PATENT DOCUMENTS

| | | | | |
|---|---|---|---|---|
| 4,680,853 | A | 7/1987 | Lidow et al. | 29/571 |
| 4,705,759 | A | 11/1987 | Lidow et al. | 437/29 |
| 4,789,882 | A | 12/1988 | Lidow | 357/23.4 |
| 4,837,606 | A | 6/1989 | Goodman et al. | 357/23.4 |
| 4,904,614 | A | 2/1990 | Fisher et al. | 437/41 |
| 4,941,026 | A | 7/1990 | Temple | 357/23.4 |
| 4,959,699 | A | 9/1990 | Lidow et al. | 357/23.7 |
| 4,974,059 | A | 11/1990 | Kinzer | 357/23.4 |
| 4,975,751 | A | 12/1990 | Beasom | 357/13 |
| 5,008,725 | A | 4/1991 | Lidow et al. | 357/23.4 |
| 5,016,066 | A | 5/1991 | Takahashi | 357/23.4 |
| 5,023,692 | A | 6/1991 | Wodarczyk | 357/43 |
| 5,079,608 | A | 1/1992 | Wodarczyk | 357/23.13 |
| 5,095,343 | A | 3/1992 | Klodzinski | 357/23.4 |
| 5,113,236 | A | 5/1992 | Arnold et al. | 357/41 |
| 5,130,767 | A | 7/1992 | Lidow | 357/23.4 |
| 5,134,321 | A | 7/1992 | Mehta | 307/571 |
| 5,191,396 | A | 3/1993 | Lidow et al. | 257/339 |
| 5,213,986 | A | 5/1993 | Pinker et al. | 437/20 |
| 5,216,807 | A | 6/1993 | Yoshizawa et al. | 29/876 |
| 5,229,633 | A | 7/1993 | Fisher et al. | 257/339 |
| 5,246,870 | A | 9/1993 | Merchant | 437/21 |
| 5,283,201 | A | 2/1994 | Tsang et al. | 437/31 |
| 5,300,448 | A | 4/1994 | Merchant et al. | 437/41 |
| 5,338,961 | A | 8/1994 | Lidow et al. | 257/342 |
| 5,350,932 | A | 9/1994 | Malhi | 257/67 |
| 5,362,979 | A | 11/1994 | Merchant | 257/340 |
| 5,391,908 | A | 2/1995 | Walker et al. | 257/409 |
| 5,399,892 | A | 3/1995 | Neilson | 257/341 |
| 5,412,241 | A | 5/1995 | Merchant | 257/409 |
| 5,445,978 | A | 8/1995 | Yilmaz | 437/41 |
| 5,468,668 | A | 11/1995 | Neilson | 437/51 |
| 5,497,285 | A | 3/1996 | Nadd | 361/103 |
| 5,545,908 | A | 8/1996 | Tokura et al. | 257/341 |
| 5,578,508 | A | 11/1996 | Baba et al. | 437/35 |
| 5,598,018 | A | 1/1997 | Lidow | 257/342 |
| 5,623,152 | A | 4/1997 | Majumdar et al. | 257/330 |
| 5,640,034 | A | 6/1997 | Malhi | 257/341 |
| 5,648,671 | A | 7/1997 | Merchant | 257/347 |
| 5,661,314 | A | 8/1997 | Merrill | 257/144 |
| 5,672,526 | A | 9/1997 | Kawamura | 437/41 R |
| 5,701,026 | A | 12/1997 | Fujishima et al. | 257/510 |
| 5,710,451 | A | 1/1998 | Merchant | 257/347 |
| 5,710,455 | A | 1/1998 | Bhatnagar et al. | 257/472 |
| 5,731,604 | A | 3/1998 | Kinzer | 257/153 |
| 5,742,087 | A | 4/1998 | Lidow | 257/342 |
| 5,766,966 | A | 6/1998 | Ng | 437/40 |
| 5,767,547 | A | 6/1998 | Merchant et al. | 257/347 |
| 5,844,275 | A | 12/1998 | Kitamura et al. | 257/335 |
| 5,885,878 | A | 3/1999 | Fujishima et al. | 438/302 |
| 5,918,137 | A | 6/1999 | Ng et al. | 438/454 |
| 5,973,360 | A | 10/1999 | Tihanyi | 257/330 |
| 5,998,833 | A | 12/1999 | Baliga | 257/329 |
| 6,043,126 | A | 3/2000 | Kinzer | 438/273 |
| 6,104,062 | A | 8/2000 | Zeng | 257/341 |
| 6,114,726 | A | 9/2000 | Barkhordarian | 257/341 |
| 6,127,746 | A | 10/2000 | Clemente | 307/131 |
| 6,144,065 | A | 11/2000 | Kinzer | 257/327 |
| 6,201,279 | B1 | 3/2001 | Pfirsch | 257/333 |
| 6,441,408 | B2 | 8/2002 | Porst | 257/139 |
| 6,452,230 | B1 | 9/2002 | Boden, Jr. | 257/341 |
| 6,459,142 | B1 | 10/2002 | Tihanyi | 257/621 |
| 6,503,786 | B2 | 1/2003 | Klodzinski | 438/212 |
| 6,521,962 | B2 | 2/2003 | Evans | 257/409 |
| 6,525,383 | B1 | 2/2003 | Stecher | 257/401 |
| 6,534,836 | B1 | 3/2003 | Osanai | 257/401 |
| 6,541,820 | B1 | 4/2003 | Bol | 257/341 |

VERTICAL POWER DEVICES HAVING RETROGRADED-DOPED TRANSITION REGIONS THEREIN

CROSS-REFERENCE TO PRIORITY APPLICATIONS

This application is a continuation-in-part (CIP) of U.S. application Ser. No. 09/602,414, filed Jun. 23, 2000, now U.S. Pat. No. 6,545,316, and a continuation of U.S. application Ser. No. 09/833,132, filed Apr. 11, 2001, the disclosures of which are hereby incorporated herein by reference.

FIELD OF THE INVENTION

The present invention relates to semiconductor switching devices, and more particularly to switching devices for power switching and power amplification applications.

BACKGROUND OF THE INVENTION

Power MOSFETs have typically been developed for applications requiring power switching and power amplification. For power switching applications, the commercially available devices are typically DMOSFETs and UMOSFETs. In these devices, one main objective is obtaining a low specific on-resistance to reduce power losses. In a power MOSFET, the gate electrode provides turn-on and turn-off control upon the application of an appropriate gate bias. For example, turn-on in an N-type enhancement MOSFET occurs when a conductive N-type inversion-layer channel (also referred to as "channel region") is formed in the P-type base region in response to the application of a positive gate bias. The inversion-layer channel electrically connects the N-type source and drain regions and allows for majority carrier conduction therebetween.

The power MOSFET's gate electrode is separated from the base region by an intervening insulating layer, typically silicon dioxide. Because the gate is insulated from the base region, little if any gate current is required to maintain the MOSFET in a conductive state or to switch the MOSFET from an on-state to an off-state or vice-versa. The gate current is kept small during switching because the gate forms a capacitor with the MOSFET's base region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs by majority carrier transport through an inversion-layer channel, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop across power MOSFETs increases with increasing temperature, thereby promoting an even current distribution in parallel connected devices.

DMOSFETs and UMOSFETs are more fully described in a textbook by B. J. Baliga entitled *Power Semiconductor Devices*, PWS Publishing Co. (ISBN 0-534-94098-6) (1995), the disclosure of which is hereby incorporated herein by reference. Chapter 7 of this textbook describes power MOSFETs at pages 335–425. Examples of silicon power MOSFETs including accumulation, inversion and extended trench FETs having trench gate electrodes extending into the N+ drain contact region are also disclosed in an article by T. Syau, P. Venkatraman and B. J. Baliga, entitled *Comparison of Ultralow Specific On-Resistance UMOSFET Structures: The ACCUFET, EXTFET, INVFET, and Conventional UMOSFETs*, IEEE Transactions on Electron Devices, Vol. 41, No. 5, May (1994). As described by Syau et al., specific on-resistances in the range of 100–250 $\mu\Omega cm^2$ were experimentally demonstrated for devices capable of supporting a maximum of 25 volts. However, the performance of these devices was limited by the fact that the forward blocking voltage must be supported across the gate oxide at the bottom of the trench. U.S. Pat. No. 4,680,853 to Lidow et al. also discloses a conventional power MOSFET that utilizes a highly doped N+ region between adjacent P-base regions in order to reduce on-state resistance. For example, FIG. 22 of Lidow et al. discloses a high conductivity region having a constant lateral dopant concentration and a gradient vertical dopant concentration that extends from a relatively high concentration to a relatively low concentration beginning from the chip surface beneath the gate oxide and extending down into the body of the chip.

FIG. 1(d) from the aforementioned Syau et al. article discloses a conventional UMOSFET structure. In the blocking mode of operation, this UMOSFET supports most of the forward blocking voltage across the N-type drift layer, which must be doped at relatively low levels to obtain a high maximum blocking voltage capability, however low doping levels typically increase the on-state series resistance. Based on these competing design requirements of high blocking voltage and low on-state resistance, a fundamental figure of merit for power devices has been derived which relates specific on-resistance ($R_{on,sp}$) to the maximum blocking voltage (BV). As explained at page 373 of the aforementioned textbook to B. J. Baliga, the ideal specific on-resistance for an N-type silicon drift region is given by the following relation:

$$R_{on,sp} = 5.93 \times 10^{-9} (BV)^{2.5} \quad (1)$$

Thus, for a device with 60 volt blocking capability, the ideal specific on-resistance is 170 $\mu\Omega cm^2$. However, because of the additional resistance contribution from the channel, reported specific on-resistances for UMOSFETs are typically much higher. For example, a UMOSFET having a specific on-resistance of 730 $\mu\Omega cm^2$ is disclosed in an article by H. Chang, entitled *Numerical and Experimental Comparison of 60V Vertical Double-Diffused MOSFETs and MOSFETs With A Trench-Gate Structure*, Solid-State Electronics, Vol. 32, No. 3, pp. 247–251, (1989). However, in this device a lower-than-ideal uniform doping concentration in the drift region was required to compensate for the high concentration of field lines near the bottom corner of the trench when blocking high forward voltages. U.S. Pat. Nos. 5,637,898, 5,742,076 and 5,912,497, which are hereby incorporated herein by reference, also disclose popular power semiconductor devices having vertical current carrying capability.

In particular, U.S. Pat. No. 5,637,898 to Baliga discloses a preferred silicon field effect transistor which is commonly referred to as a graded-doped (GD) UMOSFET. As illustrated by FIG. 3 from the '898 patent, a unit cell of an integrated power semiconductor device field effect transistor may have a width "$W_c$" of 1 $\mu m$ and include a highly doped drain contact layer of first conductivity type (e.g., N+)

substrate, a drift layer of first conductivity type having a linearly graded doping concentration therein, a relatively thin base layer of second conductivity type (e.g., P-type) and a highly doped source layer of first conductivity type (e.g., N+). The drift layer may be formed by epitaxially growing an N-type in-situ doped monocrystalline silicon layer having a thickness of 4 μm on an N-type drain contact layer having a thickness of 100 μm and a doping concentration of greater than 1×10$^{18}$ cm$^{-3}$ (e.g. 1×10$^{19}$ cm$^{-3}$) therein. The drift layer also has a linearly graded doping concentration therein with a maximum concentration of 3×10$^{17}$ cm$^{-3}$ at the N+/N junction with the drain contact layer, and a minimum concentration of 1×10$^{16}$ cm$^{-3}$ beginning at a distance 3 μm from the N+/N junction (i.e., at a depth of 1 μm) and continuing at a uniform level to the upper face. The base layer may be formed by implanting a P-type dopant such as boron into the drift layer at an energy of 100 kEV and at a dose level of 1×10$^{14}$ cm$^{-2}$. The P-type dopant may then be diffused to a depth of 0.5 μm into the drift layer. An N-type dopant such as arsenic may also be implanted at an energy of 50 kEV and at dose level of 1×10$^{15}$ cm$^{-2}$. The N-type and P-type dopants can then be diffused simultaneously to a depth of 0.5 μm and 1.0 μm, respectively, to form a composite semiconductor substrate containing the drain contact, drift, base and source layers.

A stripe-shaped trench having a pair of opposing sidewalls which extend in a third dimension (not shown) and a bottom is then formed in the substrate. For a unit cell having a width W$_c$ of 1 μm, the trench is preferably formed to have a width "W$_t$" of 0.5 μm at the end of processing. An insulated gate electrode, comprising a gate insulating region and an electrically conductive gate (e.g., polysilicon), is then formed in the trench. The portion of the gate-insulating region extending adjacent the trench bottom and the drift layer may have a thickness "T$_1$" of about 2000 Å to inhibit the occurrence of high electric fields at the bottom of the trench and to provide a substantially uniform potential gradient along the trench sidewalls. The portion of the gate insulating region extending opposite the base layer and the source layer may have a thickness "T$_2$" of about 500 Å to maintain the threshold voltage of the device at about 2–3 volts. Simulations of the unit cell at a gate bias of 15 Volts confirm that a vertical silicon field effect transistor having a maximum blocking voltage capability of 60 Volts and a specific on-resistance (R$_{sp,on}$) of 40 μΩcm$^2$, which is four (4) times smaller than the ideal specific on-resistance of 170 μΩcm$^2$ for a 60 volt power UMOSFET, can be achieved. Notwithstanding these excellent characteristics, the transistor of FIG. 3 of the '898 patent may suffer from a relatively low high-frequency figure-of-merit (HFOM) if the overall gate-to-drain capacitance (C$_{GD}$) is too large. Improper edge termination of the MOSFET may also prevent the maximum blocking voltage from being achieved. Additional UMOSFETs having graded drift regions and trench-based source electrodes are also disclosed in U.S. Pat. No. 5,998,833 to Baliga, the disclosure of which is hereby incorporated herein by reference.

Power MOSFETs may also be used in power amplification applications (e.g., audio or rf). In these applications the linearity of the transfer characteristic (e.g., I$_d$ v. V$_g$) becomes very important in order to minimize signal distortion. Commercially available devices that are used in these power amplification applications are typically the LDMOS and gallium arsenide MESFETs. However, as described below, power MOSFETs including LDMOS transistors, may have non-linear characteristics that can lead to signal distortion. The physics of current saturation in power MOSFETs is described in a textbook by S. M. Sze entitled "Physics of Semiconductor Devices, Section 8.2.2, pages 438–451 (1981). As described in this textbook, the MOSFET typically works in one of two modes. At low drain voltages (when compared with the gate voltage), the MOSFET operates in a linear mode where the relationship between I$_d$ and V$_g$ is substantially linear. Here, the transconductance (g$_m$) is also independent of V$_g$:

$$g_m=(Z/L)\mu_{ns}C_{ox}V_d \qquad (2)$$

where Z and L are the channel width and length, respectively, μ$_{ns}$ is the channel mobility, C$_{ox}$ is the specific capacitance of the gate oxide, and V$_d$ is the drain voltage. However, once the drain voltage increases and becomes comparable to the gate voltage (V$_g$), the MOSFET operates in the saturation mode as a result of channel pinch-off. When this occurs, the expression for transconductance can be expressed as:

$$g_m=(Z/L)\mu_{ns}C_{ox}(V_g-V_{th}) \qquad (3)$$

where V$_g$ represents the gate voltage and V$_{th}$ represents the threshold voltage of the MOSFET. Thus, as illustrated by equation (3), during saturation operation, the transconductance increases with increasing gate bias. This makes the relationship between the drain current (on the output side) and the gate voltage (on the input side) non-linear because the drain current increases as the square of the gate voltage. This non-linearity can lead to signal distortion in power amplifiers. In addition, once the voltage drop along the channel becomes large enough to produce a longitudinal electric field of more than about 1×10$^4$ V/cm while remaining below the gate voltage, the electrons in the channel move with reduced differential mobility because of carrier velocity saturation.

Thus, notwithstanding attempts to develop power MOSFETs for power switching and power amplification applications, there continues to be a need to develop power MOSFETs that can support high voltages and have improved electrical characteristics, including highly linear transfer characteristics when supporting high voltages.

SUMMARY OF THE INVENTION

MOSFET embodiments of the present invention provide highly linear transfer characteristics (e.g., I$_d$ v. V$_g$) and can be used effectively in linear power amplifiers, for example. Typical applications for linear power amplifiers include rf and audio applications. These preferred linear transfer characteristics may be achieved by forming a MOSFET device having an inversion-layer channel that operates in a linear mode while other regions within the device operate in a current saturation mode. In particular, the MOSFET device is configured so that the inversion-layer channel can be operated in a linear mode (without either channel pinch-off or velocity saturation in the channel) while a drift region of the MOSFET operates in a velocity saturation mode. A transition region of first conductivity type is also preferably provided between the channel and the drift region. This transition region is preferably relatively highly doped relative to at least a portion of the drift region. The doping concentration in the transition region is preferably set at a level sufficient to enable forward on-state conduction through the channel at low drain voltages and to maintain the channel in a linear mode of operation as the drain voltage is increased and exceeds the magnitude of a voltage applied to a gate electrode of the MOSFET. This linear mode of operation is frequently referred to as a triode mode of operation. When operated in the linear mode over a significant range of gate voltages, a constant transconductance value ($\delta i_d/\delta v_{gs}$) can be achieved over a greater dynamic range.

The design of the MOSFET is such that the transition region preferably becomes fully depleted before the voltage in the channel (at the end adjacent the transition region) equals the gate voltage. As used herein, the reference to the transition region being "fully depleted" should be interpreted to mean that the transition region is at least sufficiently depleted to provide a JFET-style pinch-off of a forward on-state current path that extends across the transition region. To achieve full depletion, a relatively highly doped region of second conductivity (e.g., P+) is provided in close proximity to the transition region and is electrically connected to a source region of the MOSFET. Accordingly, as the voltage in the channel increases, the transition region becomes more and more depleted until a JFET-style pinch-off occurs within the transition region. This JFET-style pinch-off in the transition region can be designed to occur before the voltage at the drain-side of the channel ($V_{cd}$) equals the gate voltage (i.e., $V_{cd} \leq V_{gs}$) For example, the MOSFET may be designed so that the transition region becomes fully depleted when $0.1 \leq V_{cd} \leq 0.5$ Volts and $V_{gs}$= 4.0 Volts.

According to some embodiments of the present invention, an integrated power device is provided that includes an insulated-gate field effect transistor having an inversion-layer channel therein that operates in a linear mode of operation during forward on-state conduction while a drain region of the transistor simultaneously operates in a velocity saturation mode of operation. Preferably, the transistor includes a semiconductor substrate having a source region and drain contact region of first conductivity type therein. A base region of second conductivity type is also provided. This base region extends adjacent a surface of the semiconductor substrate. A transition region of first conductivity type is provided that extends to the surface and forms a rectifying junction with the base region. In addition, an insulated gate electrode extends on the surface and opposite the source, base and transition regions so that application of a gate bias of sufficient magnitude thereto induces formation of an inversion-layer channel in the base region. A drift region of first conductivity type is provided that extends between the transition region and the drain contact region. This drift region forms a first non-rectifying junction with the transition region and has a first conductivity type doping concentration therein on the drift region side of the first non-rectifying junction that is less than a first conductivity type doping concentration on the transition region side of the first non-rectifying junction.

These transistors also preferably include means, adjacent the transition region, for fully depleting the transition region while the inversion-layer channel is operating in the linear mode. The means for fully depleting the transition region may include a buried region of second conductivity type disposed adjacent the transition region. This buried region preferably forms a non-rectifying junction with the base region and is electrically connected by the base region to a source contact. The means for fully depleting the transition region may also include a region of second conductivity type that is contiguous with the base region. A trench is also provided that extends in the semiconductor substrate and has a sidewall that defines an interface with the transition region. In addition, an insulated source electrode is provided in the trench and is electrically connected to the source region by the source contact.

According to some other embodiments of the present invention, UMOSFETs may be provided that include a semiconductor substrate having a source region and a drain contact region of first conductivity type therein and a trench in the substrate. An insulated gate electrode may also be provided in the trench. The trench may include a buried source electrode that extends between the insulated gate electrode and a bottom of the trench. The buried source electrode and the source region are electrically connected together. A base region of second conductivity type is also provided in the semiconductor substrate. This base region extends to a sidewall of the trench so that application of a gate bias of sufficient magnitude to the insulated gate electrode induces formation of an inversion-layer channel in the base region. A drift region of first conductivity type is provided that extends to the sidewall of the trench and opposite the buried source electrode. During operation, this drift region operates in a velocity saturation mode. To provide isolation and improve performance by enabling linear and velocity saturation operation modes in the channel and drift region, respectively, a transition region is provided that extends between the drift region and the base region. This transition region forms non-rectifying and rectifying junctions with the drift region and base region, respectively. The transition region also has a higher first conductivity type doping concentration therein relative to a first conductivity type doping concentration in a portion of the drift region extending adjacent the non-rectifying junction. The UMOSFET may also constitute a GD-UMOSFET by doping the drift region so that it has a graded doping profile therein that increases in a direction extending from the non-rectifying junction to the drain contact region. The doping profile and shape of the base region may also be tailored so that the transition region becomes fully depleted quickly as the voltage in the channel is increased. In particular, the base and transition regions may be configured so that the transition region is fully depleted before a maximum voltage in the channel exceeds the gate voltage.

According to additional embodiments of the present invention, vertical MOSFETs may be provided that include a semiconductor substrate and a trench in the semiconductor substrate. A source electrode is also provided in the trench. This source electrode is separated from the sidewalls and bottom of the trench by an electrically insulating layer. An insulated gate electrode is also provided on a face of the semiconductor substrate and a base region of second conductivity type is provided in the semiconductor substrate. The base region extends opposite the insulated gate electrode. Preferred vertical MOSFETs also include a source region of first conductivity type that extends in the base region and forms a P-N rectifying junction therewith. To improve the device characteristics, the source region is electrically connected to the insulated source electrode. A transition region of first conductivity type is also utilized to provide isolation between the channel of the MOSFET and a drift region. This transition region extends from a sidewall of the trench to the base region and forms a P-N junction therewith so that application of a gate bias of sufficient magnitude to the insulated gate electrode induces formation of an inversion-layer channel that extends from the source region to the transition region. A drift region is also provided in the semiconductor substrate and this drift region extends adjacent the sidewall of the trench. This drift region forms a non-rectifying junction with the transition region at a location where a first conductivity type doping concentration in the drift region is less than a first conductivity type doping concentration in the transition region. In particular, a maximum first conductivity type doping concentration in the transition region is greater than about ten times a first conductivity type doping concentration in the drift region at the location of the non-rectifying junction.

According to further embodiments of the present invention, lateral MOSFETs may be provided that include a semiconductor substrate having an epitaxial region of first conductivity type therein extending to a face thereof and a base region of second conductivity type in the epitaxial region. A source region of first conductivity type also extends in the base region and forms a respective P-N junction therewith. In contrast, a drain contact region is provided in the epitaxial region, but is spaced from the base region. An insulated gate electrode is provided on the face of the substrate. This gate electrode extends opposite the base region. A preferred transition region is provided that extends in the semiconductor substrate and forms a P-N junction with the base region. The positioning of the transition region is such that the application of a gate bias of sufficient magnitude to the insulated gate electrode induces formation of an inversion-layer channel in the base region that extends from the source region to the transition region. A drift region of first conductivity type is provided that operates in a velocity saturation mode during on-state operation. This drift region extends between the transition region and the drain contact region and forms first and second non-rectifying junctions therewith, respectively. A minimum first conductivity type doping concentration in the drift region is preferably less than a maximum first conductivity type doping concentration in the transition region. A buried layer of second conductivity type is also provided. This buried layer extends diametrically opposite at least a portion of the transition region, forms a non-rectifying junction with the base region and has a higher second conductivity type doping concentration therein relative to the base region.

Additional embodiments of the present invention include methods of forming vertical power devices having a lateral MOSFETs therein, by forming a semiconductor substrate having a drift region of first conductivity type therein and a transition region of first conductivity type that extends between the drift region and a face of the substrate. The transition region has a maximum doping concentration therein that is greater than about ten times a minimum doping concentration in the drift region. A base region of second conductivity type is then formed that extends through the transition region and into the drift region. A trench is also preferably formed in the substrate. In particular, a trench is formed that extends through the transition region and into the drift region and has a sidewall that is spaced from the base region by a portion of the transition region. An insulated electrode is then formed in the trench and a gate electrode is formed on the face. To define a lateral MOSFET, a step is performed to selectively implant dopants of first conductivity type into the semiconductor substrate and thereby define a source region in the base region and a channel region extension that extends from the base region into the transition region. The formation of the channel region extension eliminates the need to extend the gate electrode laterally over the transition region. A source contact is then provided that electrically connects the source region to the insulated electrode in the trench. These embodiments provide MOSFETs having highly linear transfer characteristics (e.g., $I_d$ v. $V_g$) that can be used effectively in linear power amplifiers and in power switching applications. By using a transition region that preferably becomes fully depleted prior to channel pinch-off, the channel can be operated in a linear mode and the drift region, which supports large voltages, can be operated in a velocity saturation mode.

Vertical power devices according to further embodiments of the present invention utilize retrograded-doped transition regions to enhance forward on-state and reverse breakdown voltage characteristics. Highly doped shielding regions may also be provided that extend adjacent the transition regions and contribute to depletion of the transition regions during both forward on-state conduction and reverse blocking modes of operation.

A vertical power device (e.g., MOSFET) according to some further embodiments of the invention includes a semiconductor substrate having first and second trenches and a drift region of first conductivity type (e.g., N-type) therein that extends into a mesa defined by and between the first and second trenches. The drift region is preferably nonuniformly doped and may have a retrograded doping profile relative to an upper surface of the substrate in which the first and second trenches are formed. In particular, the substrate may include a highly doped drain contact region of first conductivity type and a drift region that extends between the drain contact region and the upper surface. The doping profile in the drift region may decrease monotonically from a nonrectifying junction with the drain contact region to the upper surface of the substrate and an upper portion of the drift region may be uniformly doped at a relatively low level (e.g., $1 \times 10^{16}$ cm$^{-3}$). First and second insulated electrodes may also be provided in the first and second trenches. These first and second insulated electrodes may constitute trench-based source electrodes in a three-terminal device.

First and second base regions of second conductivity type (e.g., P-type) are also provided in the mesa. These base regions preferably extend adjacent sidewalls of the first and second trenches, respectively. First and second highly doped source regions of first conductivity type are also provided in the first and second base regions, respectively. An insulated gate electrode is provided that extends on the mesa. The insulated gate electrode is patterned so that the upper surface preferably defines an interface between the insulated gate electrode and the first and second base regions. Inversion-layer channels are formed within the first and second base regions during forward on-state conduction, by applying a gate bias of sufficient magnitude to the insulated gate electrode.

A transition region of first conductivity type is also provided in the mesa. This transition region preferably extends between the first and second base regions and extends to the interface with the insulated gate electrode. The transition region may also form a non-rectifying junction with the drift region. This transition region may have a vertically retrograded first conductivity type doping profile relative to the upper surface. This doping profile has a peak doping concentration at a first depth relative to the upper surface, which may extend in a range from about 0.2 to 0.5 microns relative to the upper surface. Between the first depth and the upper surface, the doping profile is preferably monotonically decreasing in a direction towards the upper surface. A magnitude of a portion of a slope of this monotonically decreasing profile is preferably greater that $3 \times 10^{21}$ cm$^{-4}$. The establishment of a "buried" peak at the first depth may be achieved by performing a single implant step at respective dose and energy levels or by performing multiple implant steps at respective dose levels and different energy levels. The peak dopant concentration in the transition region is preferably greater than at least about two (2) times the transition region dopant concentration at the upper surface. More preferably, the peak dopant concentration in the transition region is greater than about ten (10) times the transition region dopant concentration at the upper surface.

According to preferred aspects of these power devices, a product of the peak first conductivity type dopant concentration in the transition region (at the first depth) and a width of the transition region at the first depth is in a range between $1\times10^{12}$ cm$^{-2}$ and $7\times10^{12}$ cm$^{-2}$ and, more preferably, in a range between about $3.5\times10^{12}$ cm$^{-2}$ and about $6.5\times10^{12}$ cm$^{-2}$. Depending on unit cell design within an integrated multi-celled device, the product of the peak first conductivity type dopant concentration in the transition region and a width of the non-rectifying junction between the transition region and the drift region may also be in a range between $1\times10^{12}$ cm$^{-2}$ and $7\times10^{12}$ cm$^{-2}$. A product of the peak first conductivity type dopant concentration in the transition region, a width of the transition region at the first depth and a width of the mesa may also be set at a level less than $2\times10^{15}$ cm$^{-1}$. To achieve sufficient charge coupling in the drift region mesa, a product of the drift region mesa width and quantity of first conductivity type charge in a portion of the drift region mesa extending below the transition region is preferably in a range between $2\times10^{9}$ cm$^{-1}$ and $2\times10^{10}$ cm$^{-1}$.

According to further aspects of these embodiments, enhanced forward on-state and reverse blocking characteristics can be achieved by including highly doped shielding regions of second conductivity type that extend in the mesa and on opposite sides of the transition region. In particular, a first shielding region of second conductivity type is provided that extends between the first base region and the drift region and is more highly doped than the first base region. Similarly, a second shielding region of second conductivity type is provided that extends between the second base region and the drift region and is more highly doped than the second base region. To provide depletion during forward on-state and reverse blocking modes of operation, the first and second shielding regions form respective P-N rectifying junctions with the transition region. High breakdown voltage capability may also be achieved by establishing a product of the peak first conductivity type dopant concentration in the transition region and a width between the first and second shielding regions in a range between $1\times10^{12}$ cm$^{-2}$ and $7\times10^{12}$ cm$^{-2}$.

Integrated vertical power devices according to still further embodiments of the invention include active unit cells that provide forward on-state current and dummy cells that remove heat from the active cells during forward on-state conduction and support equivalent maximum reverse blocking voltages. According to these embodiments, each integrated unit cell may include an active unit cell and one or more dummy unit cells. In addition to the first and second trenches, a third trench may be provided in the semiconductor substrate. The first and second trenches define an active mesa, in which an active unit cell is provided, and the second and third trenches define a dummy mesa therebetween in which a dummy unit cell is provided. A dummy base region of second conductivity type is provided in the dummy mesa preferably along with a dummy shielding region. The dummy base and shielding regions preferably extend across the dummy mesa and may be electrically connected to the first and second source regions within the active unit cell. In the event one or more dummy unit cells is provided, uniform reverse blocking voltage characteristics can be achieved by making the width of the mesa, in which the active unit cell is provided, equal to a width of the respective dummy mesa in which each of the dummy unit cells is provided. Alternatively, and in place of the third dummy base region, a field plate insulating layer may be provided on an upper surface of the dummy mesa and a third insulated electrode may be provided in the third trench. The source electrode may extend on the field plate insulating layer and is electrically connected to the first, second and third insulated electrodes within the trenches. In the event a field plate insulating layer is provided on the dummy mesa instead of using a dummy base region, the spacing between the first and second trenches need not necessarily equal the spacing between the second and third trenches in order to support maximum blocking voltages.

Additional embodiments of the present invention include methods of forming vertical power devices. These methods include implanting transition region dopants of first conductivity type at a first dose level and first energy level into a surface of a semiconductor substrate having a drift region of first conductivity type therein that extends adjacent the surface. An insulated gate electrode may then be formed on the surface. The insulated gate electrode is preferably patterned so that it extends opposite the implanted transition region dopants. Shielding region dopants of second conductivity type are then implanted at a second dose level and second energy level into the surface. This implant step is preferably performed in a self-aligned manner with respect to the gate electrode, by using the gate electrode as an implant mask. Base region dopants of second conductivity type are also implanted at a third dose level and third energy level into the surface, using the gate electrode as an implant mask. Accordingly, the base and shielding region dopants are self-aligned to each other.

A thermal treatment step is then performed to drive the implanted transition, shielding and base region dopants into the substrate and define a transition region, first and second shielding regions on opposite sides of the transition region and first and second base regions on opposite sides of the transition region. The transition region extends into the drift region and has a vertically retrograded first conductivity type doping profile therein relative to the surface. This retrograded profile is achieved by establishing a buried peak dopant concentration sufficiently below the surface. The first and second shielding regions form respective P-N rectifying junctions with the transition region and the first and second base regions also form respective P-N rectifying junctions with the transition region. The dose and implant energies associated with the base and shielding region dopants are also selected so that the shielding regions are more highly doped relative to the base regions and extend deeper into the substrate.

According to a preferred aspect of these embodiments, the first dose and energy levels and a duration of the thermal treatment step are of sufficient magnitude that a product of a peak first conductivity type dopant concentration in the transition region and a width of the transition region, as measured between the first and second shielding regions, is in a range between $1\times10^{12}$ cm$^{-2}$ and $7\times10^{12}$ cm$^{-2}$. The first and second energy levels may also be set to cause a depth of a peak second conductivity type dopant concentration in the shielding region to be within 10% of a depth of a peak first conductivity type dopant concentration in the transition region, when the depths of the peaks are measured relative to the surface.

The step of implanting shielding region dopants is also preferably preceded by the step of forming trenches in the semiconductor substrate and lining the trenches with trench insulating layers. Conductive regions are also formed on the trench insulating layers. These trench related steps may be performed before the step of implanting the transition region dopants. In this case, the transition region dopants are preferably implanted into the conductive regions within the trenches and into mesas that are defined by the trenches. According to still further preferred aspects of these embodiments, steps are performed to increase maximum on-state current density within the power device by improving the configuration of the source contact. In particular, the source contact is formed on a sidewall of the trenches by etching back the trench insulating layers to expose the source, base and shielding regions and then forming a source contact that ohmically contacts the conductive regions and also contacts the source, base and shielding regions at the sidewall of each trench.

DESCRIPTION OF PREFERRED EMBODIMENTS

Figure 1:
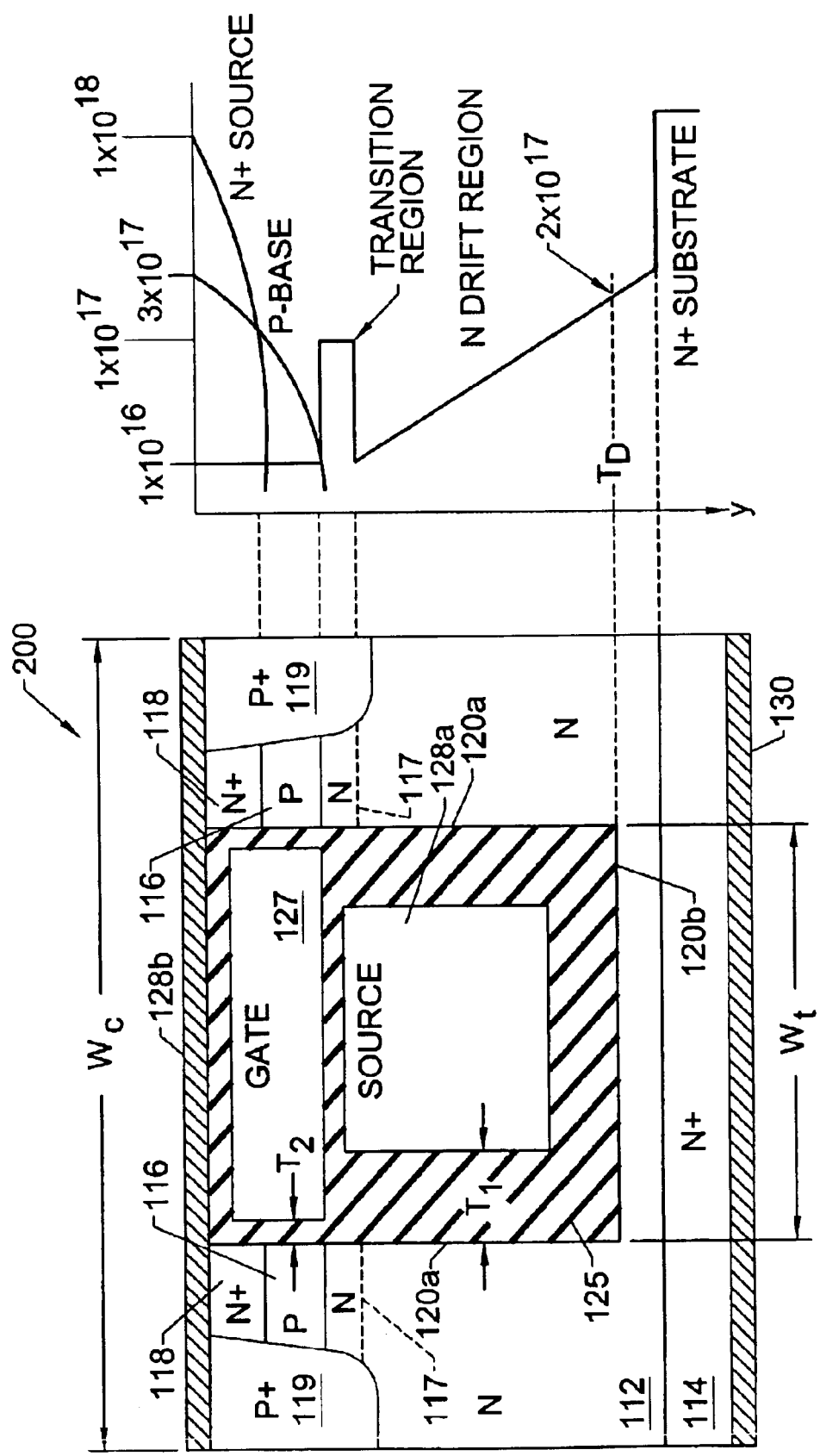
FIG. 1 is a cross-sectional view of a GD-UMOSFET and doping profile therein according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Referring now to FIG. 1, a UMOSFET according to a first embodiment of the present invention will be described. In particular, a unit cell 200 of an integrated UMOSFET has a predetermined width "$W_c$" (e.g., 1 $\mu$m) and includes a highly doped drain contact layer 114 of first conductivity type (e.g., N+), a drift layer 112 of first conductivity type having a linearly graded doping profile therein and a transition region 117 of first conductivity type which may have a relatively high N-type doping concentration therein of about $1 \times 10^{17}$ $cm^{-3}$. As illustrated, the transition region 117 forms a non-rectifying junction with the drift layer 112 and the N-type doping concentration in the transition region 117 is higher than the N-type doping concentration in a portion of the N-type drift layer 112 that extends to the non-rectifying junction with the transition region 117.

A relatively thin base layer 116 of second conductivity type (e.g., P-type) is also provided on the transition region 117 and forms a P-N rectifying junction therewith. This base layer 116 may have a thickness of about 0.2 $\mu$m. A highly doped source layer 118 of first conductivity type (e.g., N+) is also provided on the base layer 116, as illustrated. A source electrode 128b and drain electrode 130 may also be provided at the first and second faces, in ohmic contact with the source layer 118 and the drain contact layer 114, respectively. The source electrode 128b may form an ohmic contact with a P+ base region extension 119 that extends through the transition region 117. The relatively highly doped transition region 117 is provided between the base layer 116 and the drift layer 112 in order to improve performance by enabling an inversion-layer channel formed in the base layer 116 to be operated in a linear mode (without channel pinch-off or velocity saturation) while the drift region is simultaneously operated in a velocity saturation mode.

The doping concentration in the transition region 117 is preferably set at a level sufficient to enable forward on-state conduction through the inversion-layer channel at low drain voltages and to maintain the channel in a linear mode of operation as the drain voltage is increased and exceeds the magnitude of a voltage applied to a gate electrode 127. This linear mode of operation is frequently referred to as a triode mode of operation. The design of the UMOSFET is such that the transition region 117 preferably becomes fully depleted at a point when the voltage at the drain-side of the channel $V_{cd}$ (i.e., at the end adjacent the transition region 117) is $0 \leq V_{cd} \leq V_{gs}$, where $V_{gs}$ designates the gate-to-source voltage. For example, the UMOSFET may be designed so that the transition region 117 becomes fully depleted when $0.2 \leq V_{cd} \leq 0.5$ Volts and $V_{gs}$=4.0 Volts. To achieve full depletion, the P+ base region extension 119 is provided in close proximity to the transition region 117 (i.e., in the center of each mesa in a multi-celled device having a plurality of side-by-side trenches therein). Accordingly, as the voltage in the channel increases, the transition region 117 becomes more and more depleted until the transition region 117 is pinched off in manner similar to conventional operation of a JFET.

The drift layer 112 and transition region 117 may be formed by epitaxially growing an N-type in-situ doped monocrystalline silicon layer having a thickness of about 4 μm on an N-type drain contact layer 114 (e.g., N+ substrate) having a thickness of 100 μm and a first conductivity type doping concentration of greater than about $1 \times 10^{18}$ cm$^{-3}$ (e.g. $1 \times 10^{19}$ cm$^{-3}$) therein. As illustrated, the drift layer 112 may have a linearly graded doping profile therein with a maximum concentration of greater than about $5 \times 10^{16}$ cm$^{-3}$ (e.g., $3 \times 10^{17}$ cm$^{-3}$) at the N+/N non-rectifying junction with the drain contact layer 114 and a minimum concentration of about $1 \times 10^{16}$ cm$^{-3}$ at the junction with the transition region 117. The base layer 116 may be formed by implanting P-type dopants such as boron into the drift layer 112 at an energy of 100 kEV and at a dose level of $1 \times 10^{14}$ cm$^{-2}$, for example. The P-type dopants may then be diffused to a depth of 0.8 μm into the drift layer 112. An N-type dopant such as arsenic may then be implanted at an energy of 50 kEV and at dose level of $1 \times 10^{15}$ cm$^{-2}$. The N-type and P-type dopants are then diffused simultaneously to a depth of 0.5 μm and 1.0 μm, respectively. The second conductivity type (e.g., P-type) doping concentration in the base layer 116 is also preferably greater than about $5 \times 10^{16}$ cm$^{-3}$ at the P-N junction with the source layer 118 (i.e., first P-N junction). A selective implanting step may also be performed at a relatively high dose and high energy level to define the P+ base region extension 119.

A stripe-shaped trench having a pair of opposing sidewalls 120a which extend in a third dimension (not shown) and a bottom 120b is then formed in the substrate. For a unit cell 100 having a width $W_c$ of 1 μm, the trench is preferably formed to have a width "$W_t$" of 0.5 μm at the end of processing. A gate electrode/source electrode insulating region 125, a gate electrode 127 (e.g., polysilicon) and a trench-based source electrode 128a (e.g., polysilicon) are also formed in the trench. Because the gate electrode 127 is made relatively small and does not occupy the entire trench, the amount of gate charge required to drive the unit cell 200 during switching is much smaller than the amount of gate charge required to drive the unit cell 100 of FIG. 2 (assuming all other parameters and dimensions are equal).

Here, the trench-based source electrode 128a is electrically connected to the source electrode 128b in a third dimension (not shown). The portion of the gate electrode/source electrode insulating region 125 extending adjacent the trench bottom 120b and the drift layer 112 may also have a thickness "$T_1$" in a range between about 1500 Å and 5000 Å, for example, to inhibit the occurrence of high electric field crowding at the bottom corners of the trench and to provide a substantially uniform potential gradient along the trench sidewalls 120a. However, the portion of the gate electrode/source electrode insulating region 125 extending opposite the base layer 116 and the source layer 118 preferably has a thickness "$T_2$" of less than about 750 Å, and more preferably about 250 Å to maintain the threshold voltage of the device at about 2–3 volts.

Simulations of the device of FIG. 1 were also performed for a unit cell having a half-cell pitch of 1 μm with a half-mesa width of 0.5 μm. The thickness $T_2$ was set to 250 Å and the thickness of the base layer 116 was set to 0.2 μm with a peak doping concentration of $2 \times 10^{17}$ cm$^{-3}$. The gate electrode 127 extended to a depth of 0.6 μm and the trench depth was set to 4.7 μm. The thickness $T_1$ was also set to 3000 Å. The doping concentrations in the transition region 117 and drift layer 112 follow the profile illustrated by FIG. 1. Based on these characteristics, excellent current saturation characteristics were observed with uniform spacing between the $I_d$ v. $V_d$ curves (at gate biases ranging from 2 to 4 volts). Highly linear $I_d$ v. $V_g$ transfer characteristics for gate biases in the range from 2 to 4 volts were also observed.

Figure 2:
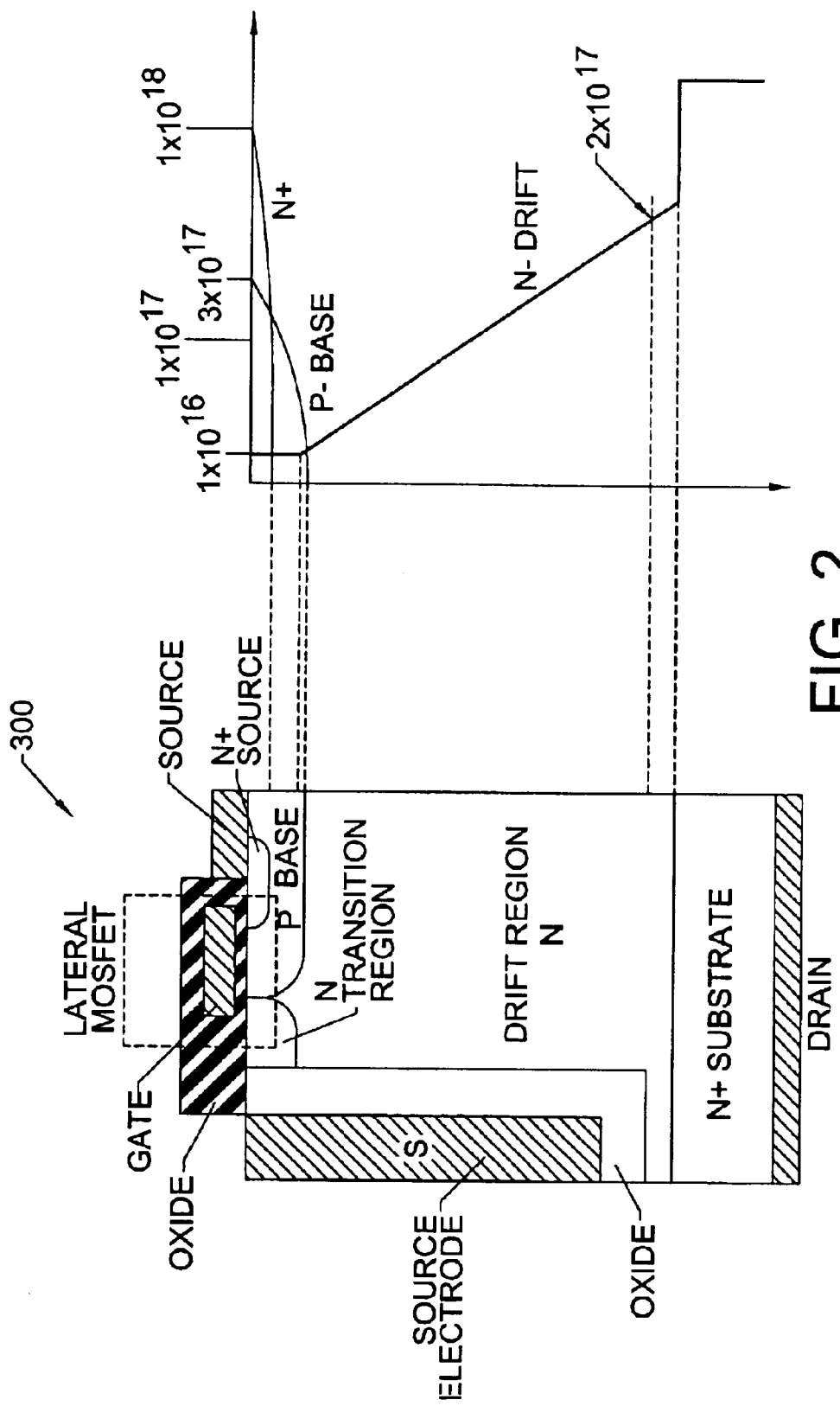
FIG. 2 is a cross-sectional view of a vertical device comprising a lateral MOSFET and doping profile therein according to an embodiment of the present invention.

Referring now to FIG. 2, a preferred vertical device 300 having a lateral MOSFET region therein according to another embodiment of the present invention will be described. As illustrated, the preferred device 300 includes a lateral MOSFET on a face of a semiconductor substrate. The source, channel and drain regions of the lateral MOSFET include an N+ source region, a P-type base region and an N-type transition region. The N-type transition region and the P-type base region are provided in an N-type drift region having a graded doping profile therein. The vertical doping profile of the source, base and drift regions are illustrated by the right hand side of FIG. 2. A trench is also provided in the substrate, as illustrated. This trench is preferably lined with an electrically insulating layer (e.g., oxide) and filled with a source electrode. The transition region, which may be doped to a relatively high level of $1 \times 10^{17}$ cm$^{-3}$ relative to an upper portion of the drift region, extends from a sidewall of the trench to the P-type base region. The transition region forms a non-rectifying junction with the drift region and forms a P-N rectifying junction with the base region. As will be understood by those skilled in the art, the application of a sufficiently positive gate bias to the gate electrode of the lateral MOSFET will induce the formation of an inversion-layer channel in a portion of the base region extending immediately underneath the gate electrode. This inversion-layer channel will electrically connect the source region to the transition region during forward on-state operation when the drain contact is biased positive relative to the source contact. The gate electrode may also be patterned to extend relatively close to the sidewall of the trench in order to provide sufficient electrical connection between the channel and the transition region (by countering the effects of the built-in depletion region at the P-N junction between the transition region and base region).

According to a preferred aspect of this embodiment, the drift region forms a non-rectifying junction with the transition region at a location where a first conductivity type doping concentration in the drift region is less than a first conductivity type doping concentration in the transition region. In particular, a maximum first conductivity type doping concentration in the transition region is preferably greater than about ten times a first conductivity type doping concentration in the drift region at the location of the non-rectifying junction. As illustrated, this non-rectifying junction extends from the sidewall of the trench to the P-type base region. The design of the device 300 is such that the transition region becomes fully depleted at a point before the voltage in the channel (at the transition region side) equals the gate voltage and, more preferably, at a point when the voltage in the channel is only a small fraction of the gate voltage. To achieve full depletion, the P-type base region is doped at a sufficiently high level (and has sufficient depth) so that the depletion region formed at the P-N junction between the transition region and the P-type base region extends primarily on the side of the transition region when the P-N junction becomes reverse biased. Accordingly, as the voltage in the channel increases, the transition region becomes increasingly depleted until the transition region is pinched off.

Simulations of the device of FIG. 2 were also performed for a lateral MOSFET having a channel length of 0.2 μm and the vertical doping profile illustrated by FIG. 2. The N-type doping concentration in the transition region was also set to $1 \times 10^{17}$ cm$^{-3}$ and the doping concentration in the drift region was $1 \times 10^{16}$ cm$^{-3}$ at the non-rectifying junction with the transition region. Based on these characteristics, excellent current saturation characteristics were observed with uniform spacing between the $I_d$ v. $V_d$ curves (at gate biases ranging from 2 to 3 volts). Highly linear $I_d$ v. $V_g$ transfer characteristics for gate biases in the range from 2 to 3 volts were also observed.

Figure 3A:
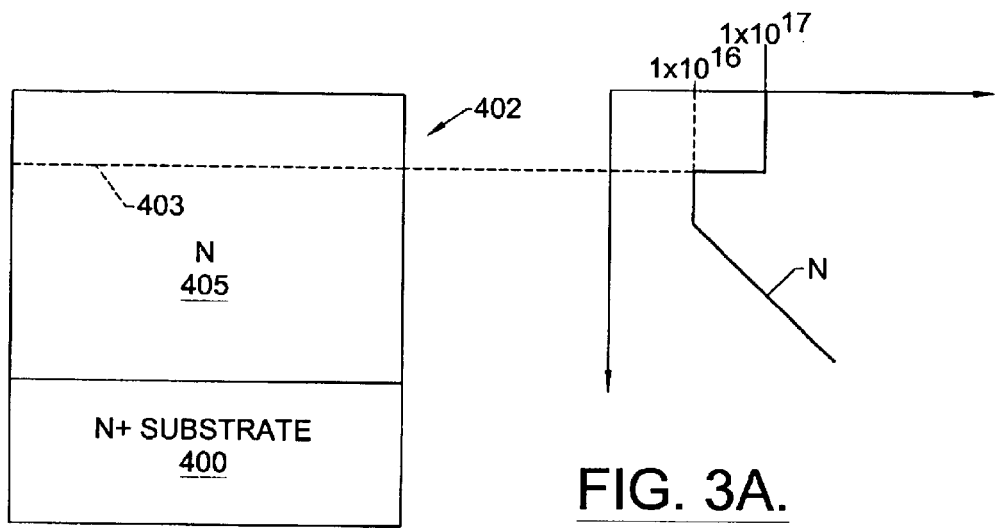
FIGS. 3A–3G are cross-sectional view of intermediate structures that illustrate preferred methods of forming power devices according to embodiments of the present invention.
Figure 3B:
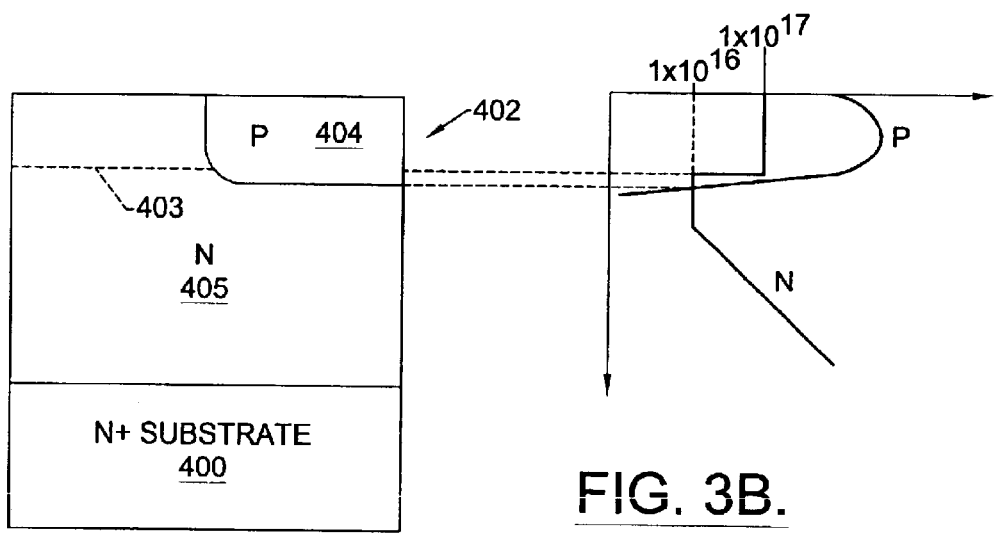

Referring now to FIGS. 3A–3G, preferred methods of forming a preferred vertical device having a lateral MOSFET therein will be described. In particular, FIG. 3A illustrates the steps of growing an N-type in-situ doped epitaxial layer 402 on a highly doped semiconductor substrate layer 400 (e.g., drain contact layer). As illustrated by the right hand side of FIG. 3A, the epitaxial layer 402 includes a drift region 405 having a graded doping profile therein and an N-type transition region 403 on the drift region 405. As illustrated, the N-type transition region 403 extends to an upper surface of the epitaxial layer 402 and may be doped to a level of about $1 \times 10^{17}$ cm$^{-3}$. A minimum doping concentration in the drift region 405 may also be set to a level of about $1 \times 10^{16}$ cm$^{-3}$. Referring now to FIG. 3B, a first mask (not shown) may be used during the step of selectively implanting P-type base region dopants into the epitaxial layer 402. An annealing step may then be performed to partially drive in the implanted P-type base region dopants and define a base region 404. As illustrated, the P-type base region 404 may be considerably more highly doped than the transition region 403 and may extend deeper into the epitaxial layer 402 than the transition region 403. The base region 404 may also have a relatively high peak doping concentration which is spaced from the surface of the epitaxial layer 402. In particular, the doping concentration at the surface of the base region 404 may be lower than the peak in order to establish a desired threshold voltage and the peak value may be established at a value that provides sufficient depletion to the transition region 403 during on-state operation.

Figure 3C:
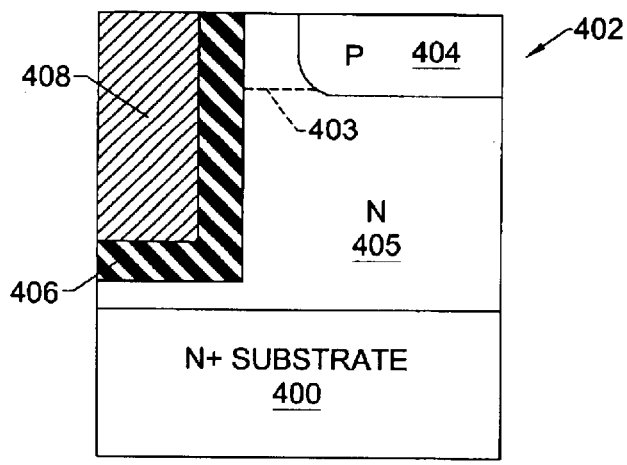
Figure 3D:
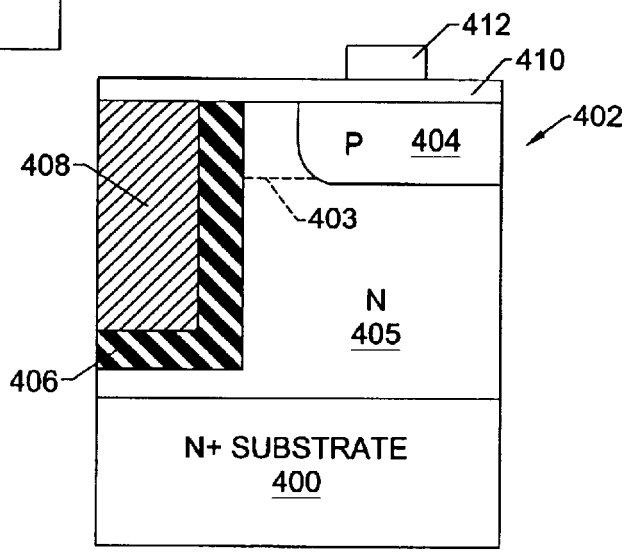

As illustrated by FIG. 3C, a trench is then formed in the epitaxial layer 402, using conventional photolithographically defined etching steps. The sidewalls and bottom of the trench are then lined with an electrically insulating layer 406. The spacing between a sidewall of the trench and the base region 404 is designed so that notwithstanding the relatively high doping concentration in the transition region 403, the transition region 403 can become fully depleted once a sufficient reverse bias is established across the P-N junction between the transition region 403 and the base region 404. For example, a conformal oxide deposition step may be performed to define an oxide insulating layer on the surface of the epitaxial layer 402 and in the trench. The trench may then be refilled with a doped polysilicon region 408, for example. A conventional planarization step may then be performed to planarize the doped polysilicon region 408 and the electrically insulating layer 406, and expose the surface of the epitaxial layer 402. Referring now to FIG. 3D, conventional steps may then be performed to grow or deposit a gate oxide layer 410 on the surface and on the polysilicon region 408. A layer of doped polysilicon may then be deposited on the gate oxide layer 410. This layer may then be patterned using conventional techniques to define a gate electrode 412 which extends opposite the base region 404.

Figure 3E:
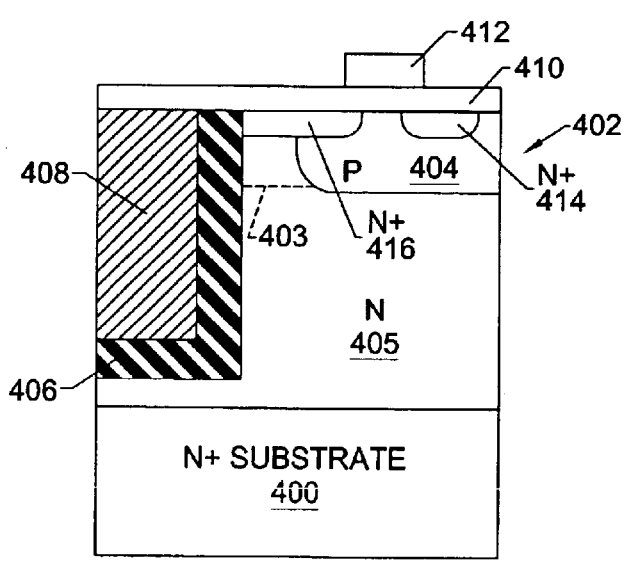
Figure 3F:
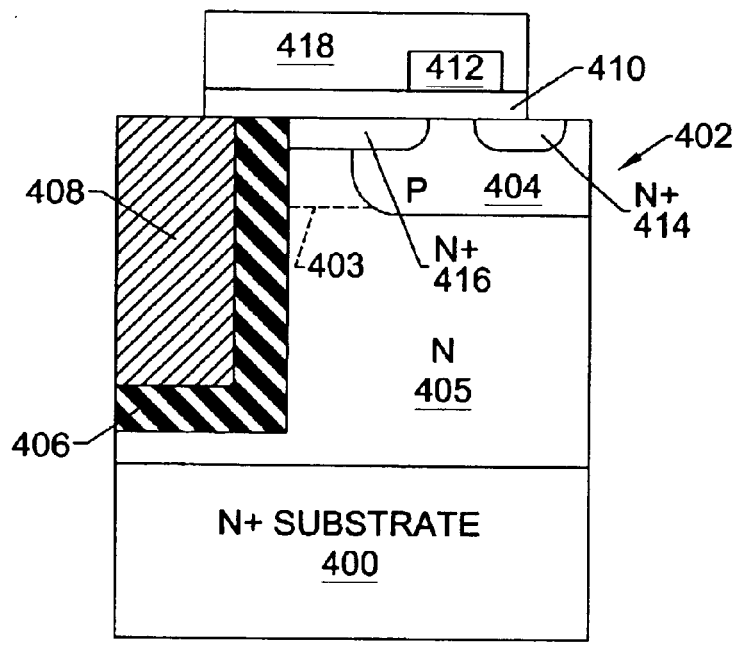
Figure 3G:
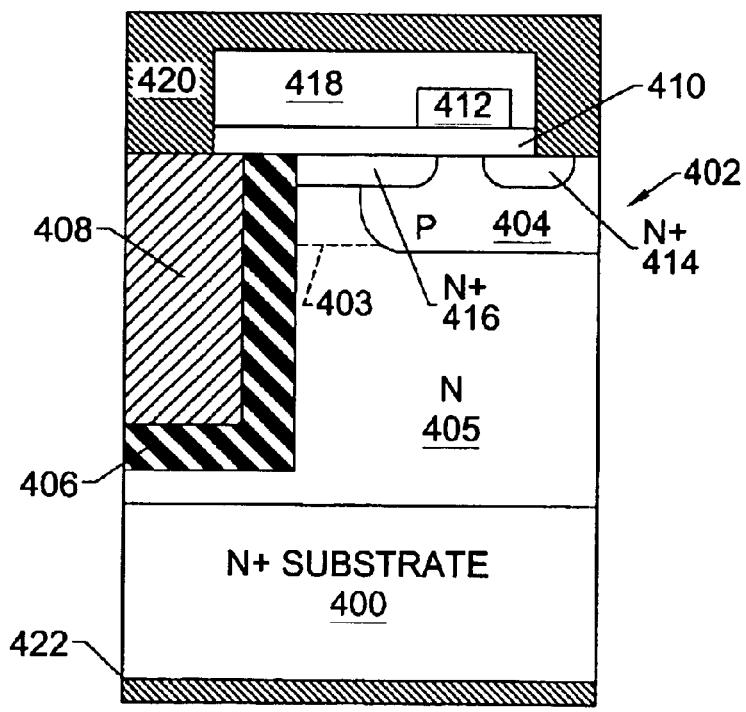

Referring now to FIG. 3E, a source region 414 and a channel region extension 416 may then be formed by implanting N-type dopants at a high dose level into the epitaxial layer 402, using the gate electrode 412 and another patterned photoresist layer (not shown) as an implant mask. The channel region extension 416 is preferably designed to improve the electrical connection between an inversion-layer channel in the base region 404 during forward on-state operation and eliminate the additional gate capacitance associated with extending the gate electrode laterally over the N-type transition region 403. An annealing step may then be performed to drive-in the implanted N-type dopants and further drive-in the P-type dopants in the base region 404. As illustrated by FIG. 3F, a blanket layer of a relatively thick passivation oxide 418 may be deposited and patterned to define contact windows therein. Then, as illustrated by FIG. 3G, a layer of metallization may be deposited and then patterned to define a source electrode 420. Similarly, a layer of metallization may be deposited on the backside of the substrate as a drain electrode 422.

Figure 4:
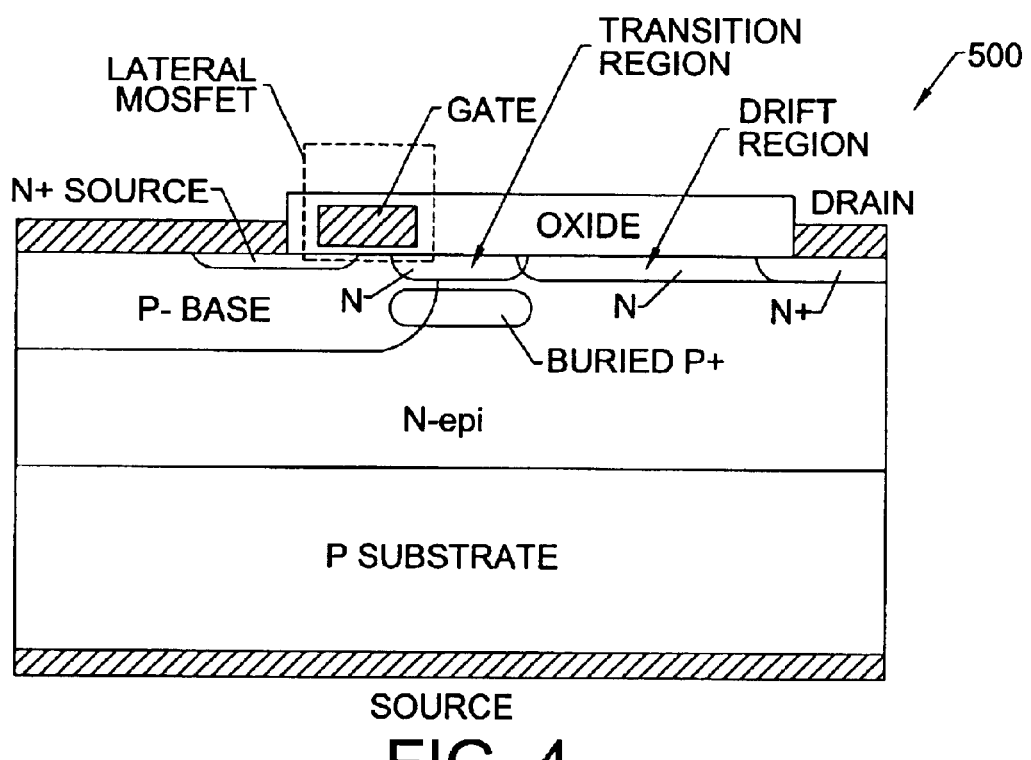
FIG. 4 is a cross-sectional view of a lateral MOSFET according to an embodiment of the present invention.

Referring now to FIG. 4, a preferred lateral MOSFET (e.g., LDMOS) includes a P-type base region that may be formed in an N-type epitaxial layer. The N-type epitaxial layer may be formed on a P-type substrate, as illustrated, using conventional techniques. A gate oxide insulating layer and a gate electrode are also preferably provided on a surface of the N-type epitaxial layer. As illustrated, the gate electrode extends opposite the P-type base region. A selective implanting step may then be performed to define an N+ source region in the base region, using the gate electrode as an implant mask, and define an N+ drain contact region. Another selective implanting step may also be performed to define an N-type transition region which extends in the P-type base region and the N-type epitaxial layer, as illustrated. This implanting step may be performed at a dose sufficient to provide a transition region with a doping concentration of about $1 \times 10^{17}$ cm$^{-3}$ therein. The same implant mask used to define the transition region may also be used as an implant mask during the step of implanting P-type dopants into the base region and epitaxial layer. This latter selective implant step may be performed at a respective dose level and energy level sufficient to define a buried P+ layer which is aligned with the transition region. As illustrated, this buried P+ layer forms a non-rectifying junction with the P-base region and is electrically connected by the P-base region to a source electrode. A selective implant step may also be performed to define a lateral N-type drift region that electrically connects the transition region to the drain contact region. In particular, the N-type drift region preferably forms a non-rectifying junction with the transition region at a point where the N-type doping concentration in the transition region is about ten times greater than the N-type doping concentration in the drift region. Conventional techniques may also be performed to define a drift region having a lateral doping profile that increases in a direction from the transition region to the drain contact region. To provide coupling between the source contact and the drift region, the source contact may be patterned to extend over the drift region, as illustrated.

Figure 5B:
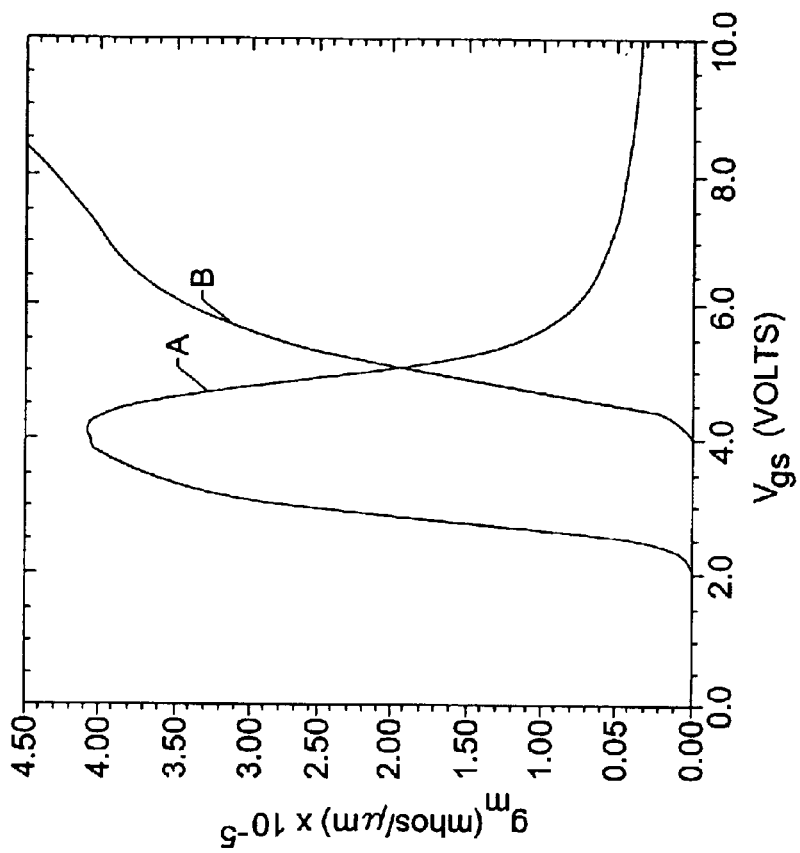
FIG. 5B is a graph of transconductance versus gate voltage corresponding to the transfer curves of FIG. 5A.
Figure 5A:
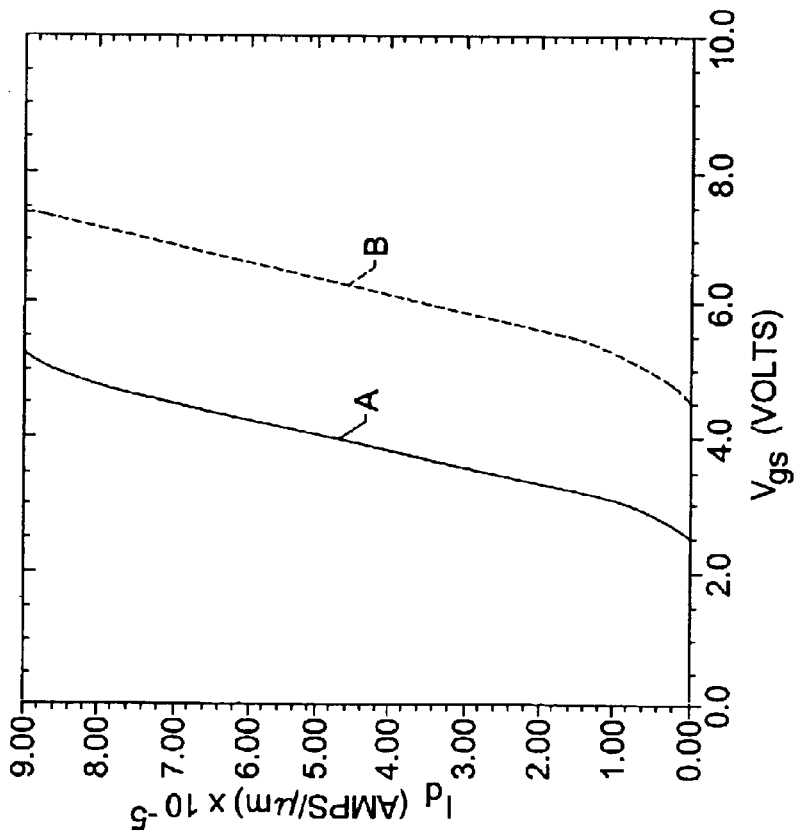
FIG. 5A is a graph illustrating transfer curves which may be achieved when the device of FIG. 4 is designed with the transition region and buried P+ layer (curve A) and without the transition region and buried layer (curve B).

Transfer curves and graphs of transconductance as a function of gate voltage are provided by FIGS. 5A–5B. In particular, FIG. 5A illustrates exemplary transfer curves associated with the device of FIG. 4, with the transition region and buried P+ layer (curve A) and without the transition region and buried P+ layer (curve B). As illustrated by curve A relative to curve B in FIG. 5A, a more linear transfer characteristic can be obtained using the combination of the transition region and the P+ buried layer which can be designed to fully deplete the transition region when $V_{cd}$=0.2 volts, for example. The fact that curve A of FIG. 5A yields a more linear transfer characteristic than curve B can best be illustrated by the transconductance curves of FIG. 5B. In particular, curve A of FIG. 5B has a flat transconductance ($g_m \approx 4 \times 10^{-5}$ mhos/micron) at about 4 volts. If the gate voltage swing is 0.5 volts at the point where the tranconductance is flat, a 1% variation in $g_m$ may be achieved. In contrast, at a $g_m \approx 4 \times 10^{-5}$ mhos/micron and voltage of about 7 Volts, curve B demonstrates a 7.5% variation in $g_m$ when the transition region and buried P+ layer are not used. Thus, the device of FIG. 4 can be expected to have a much greater dynamic range.

Figure 6:
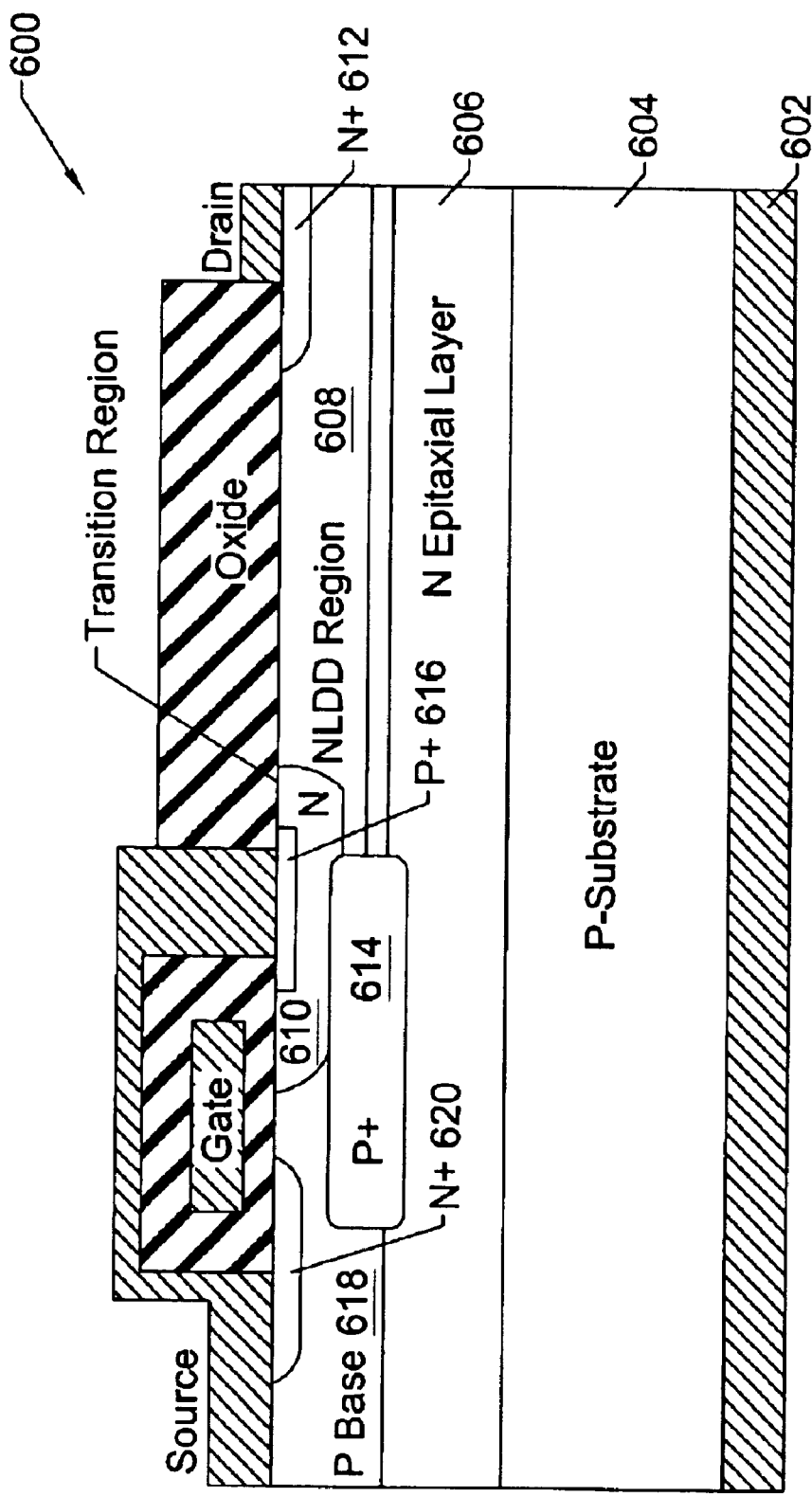
FIG. 6 is a cross-sectional view of a lateral MOSFET device according to an embodiment of the present invention.

Referring now to FIG. 6, a cross-sectional view of another preferred lateral MOSFET device 600 will be described. The device 600 includes an epitaxial layer 606 of first conductivity type (e.g., N-type) on a semiconductor substrate layer 604 of second conductivity type (e.g., P-type). A substrate contact 602 is also provided on a second face of the composite semiconductor substrate. A base region 618 of second conductivity type is provided in the epitaxial layer 606, as illustrated. A composite drain region of first conductivity type is also provided in the epitaxial layer 606. The composite drain region includes an transition region 610 (shown as N-type), a drift region 608 (shown as an N-type LDD region) and a drain contact region 612 (shown as N+). A drain efectrode (DRAIN) may also be provided on the drain contact region 612, as illustrated. The drift region 608 may have a uniform first conductivity type doping concentration therein that is less than a first conductivity type doping concentration in the transition region 610. Alternatively, the drift region 608 may have a laterally graded doping profile therein that increases in a direction extending from the transition region 610 to the drain contact region 612. The transition region 610 may be doped to a level of about $2 \times 10^{17}$ cm$^{-3}$ and a portion of the drift region 608 extending closely adjacent the transition region 610 may be doped to a level of about $1 \times 10^{16}$ cm$^{-3}$. The lateral MOSFET device 600 also preferably includes a source region 620 which extends within the base region 618. As will be understood by those skilled in the art, the application of a gate bias of sufficient magnitude to the gate electrode (GATE) will induce formation of an inversion-layer channel in the base region 618. This inversion-layer channel will electrically connect the source region 620 to the transition region 610. According to a preferred aspect of this embodiment of the present invention, during on-state operation, the channel can be maintained in a linear mode of operation with the maximum voltage in the channel being held at a level substantially below the magnitude of the gate bias.

Moreover, first and second control regions 614 and 616 of second conductivity type (shown as P+) can be used as means for depleting the transition region 610 as the drain-to-source voltage is increased. As illustrated, both the first and second control regions 614 and 616 are electrically connected to the source contact (SOURCE). The second control region 616 is electrically connected to the source contact at the first face of the composite semiconductor substrate and the first control region 614 is electrically connected by the base region 618 to the source contact. The spacing between opposing sides of the first and second control regions 614 and 616 influences the level at which a positive drain-to-source voltage will completely pinch-off a portion of the transition region 610 extending between the opposing sides. The use of a second control region 616 in addition to the first control region 614 (which is similar to the P+ buried region of FIG. 4) enables the use of a more highly doped transition region 610. For example, relative to the transition region in the device of FIG. 4, the transition region 610 in the device of FIG. 6 may have twice the charge before it fully depletes at the same drain-to-source voltage. The ability to provide a high transition region charge increases the dynamic range ($V_{gate}$ swing) over which the transconductance is constant (see, e.g., curve A in 5B).

Figure 7:
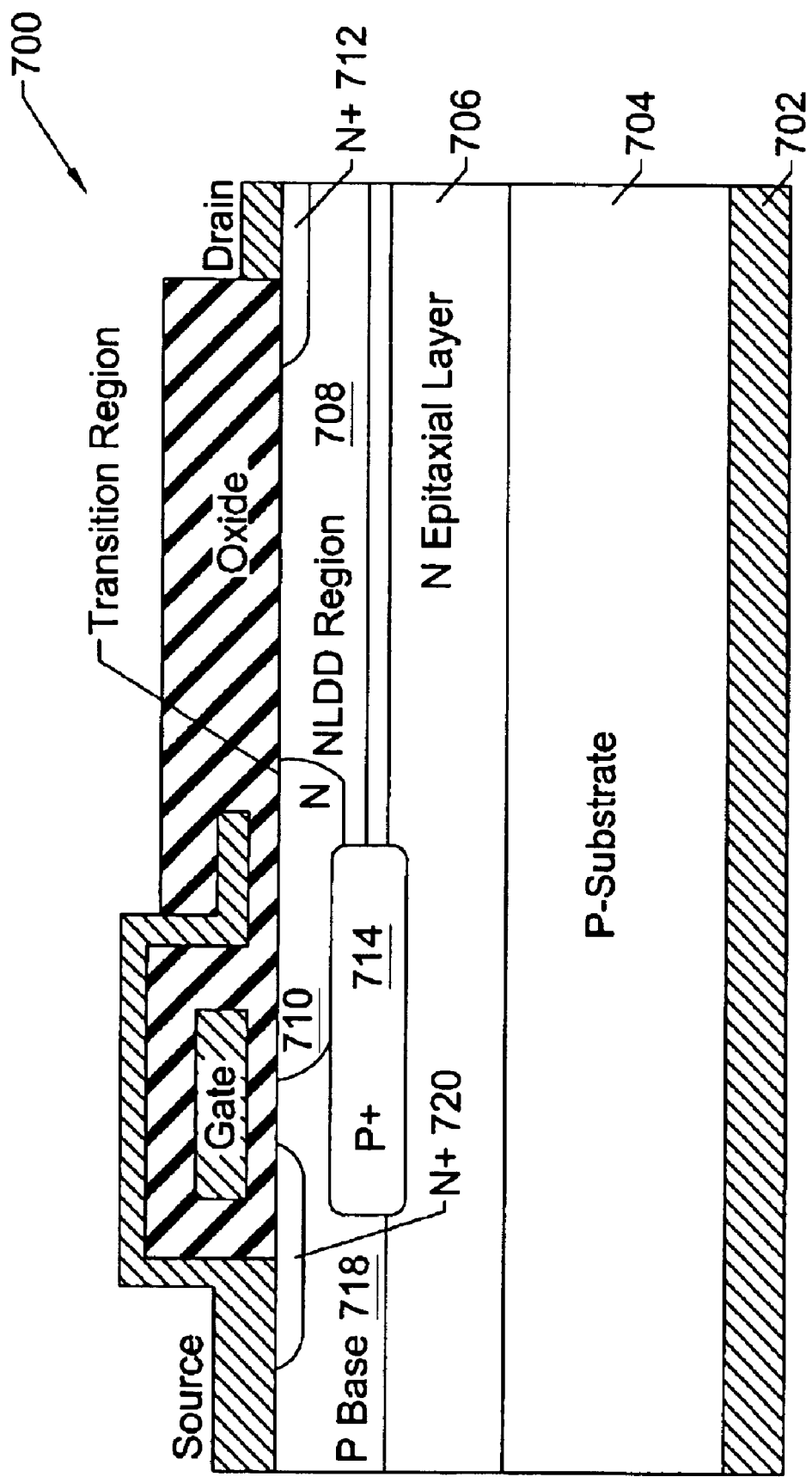
FIG. 7 is a cross-sectional view of a lateral MOSFET device according to an embodiment of the present invention.

Referring now to FIG. 7, a cross-sectional view of another preferred lateral MOSFET device 700 will be described. The device 700 includes an epitaxial layer 706 of first conductivity type (e.g., N-type) on a semiconductor substrate layer 704 of second conductivity type (e.g., P-type). A substrate contact 702 is also provided on a second face of the composite semiconductor substrate. A base region 718 of second conductivity type is provided in the epitaxial layer 706, as illustrated. A composite drain region of first conductivity type is also provided in the epitaxial layer 706. The composite drain region includes an transition region 710 (shown as N-type), a drift region 708 (shown as an N-type LDD region) and a drain contact region 712 (shown as N+). A drain contact (DRAIN) may also be provided on the drain contact region 712, as illustrated. The drift region 708 may have a uniform first conductivity type doping concentration therein that is less than a first conductivity type doping concentration in the transition region 710. Alternatively, the drift region 708 may have a laterally graded doping profile therein that increases in a direction extending from the transition region 710 to the drain contact region 712. The transition region 710 may be doped to a level of about $2 \times 10^{17}$ cm$^{-3}$ and a portion of the drift region 708 extending closely adjacent the transition region 710 may be doped to a level of about $1 \times 10^{16}$ cm$^{-3}$. The lateral MOSFET device 700 also preferably includes a source region 720 which extends within the base region 718. As will be understood by those skilled in the art, the application of a gate bias of sufficient magnitude to the gate electrode (GATE) will induce formation of an inversion-layer channel in the base region 718. This inversion-layer channel will electrically connect the source region 720 to the transition region 710. A buried P+ region 714 is also provided for depleting the transition region 710 while the channel is operating in a linear mode. To increase the degree of depletion for a given drain-to-source bias, the source contact (SOURCE) is extended opposite the transition region 710 and is insulated and spaced therefrom by a relatively thin insulating layer (e.g., oxide layer). During on-state operation, the reverse bias established across the metal-insulator-semiconductor (MIS) junction between the source contact extension and the transition region 710 will and induce further depletion of the transition region 710.

Figure 8:
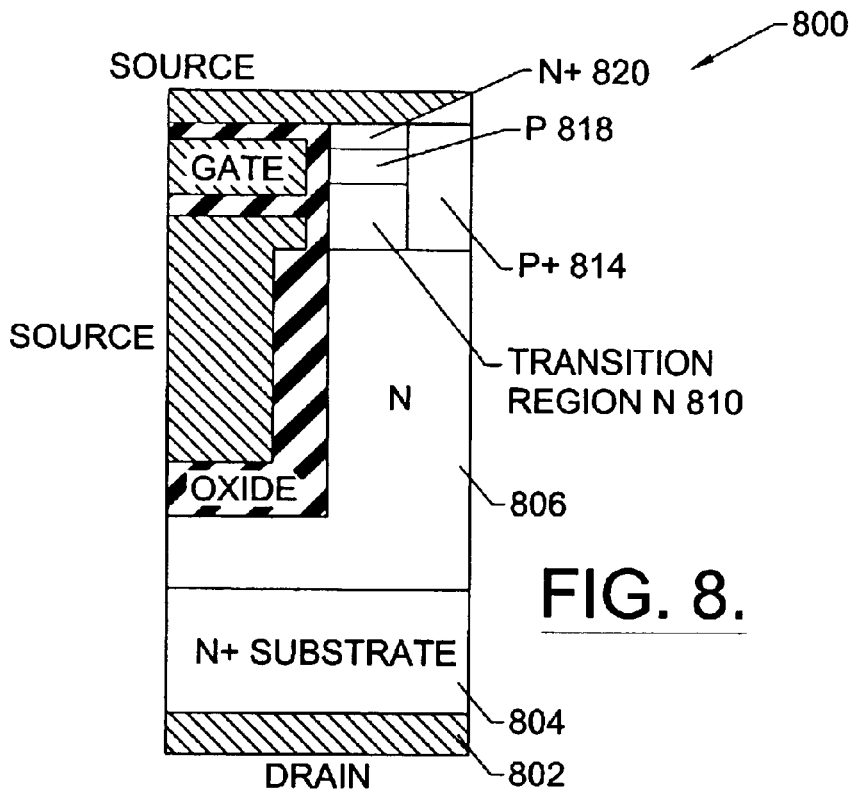
FIG. 8 is a cross-sectional view of a vertical MOSFET device according to an embodiment of the present invention.

Referring now to FIG. 8, another preferred UMOSFET device 800 will be described. This device 800 is similar to the device of FIG. 1, however, a portion of the trench oxide extending between the buried source electrode in the trench and the transition region 810 is thinned in order to increase the degree of coupling between the buried source electrode and the transition region 810 and thereby increase the rate at which the transition region 810 becomes depleted as the drain-to-source voltage is increased during forward on-state operation. As illustrated by FIG. 8, the UMOSFET device 800 includes an N+ substrate layer 804 (e.g., drain contact layer), a drain electrode 802 and a drift region 806 which may have a graded doping profile therein. A P-type base region 818 is also provided between the transition region 810 and a source region 820. A highly doped base region extension 814 is also provided, as illustrated. This base region extension 814 operates in combination with the buried source electrode in the trench to deplete the transition region 810 fully before the inversion-layer channel in the base region 818 becomes pinched off (i.e., before it exits the linear mode).

Figure 9:
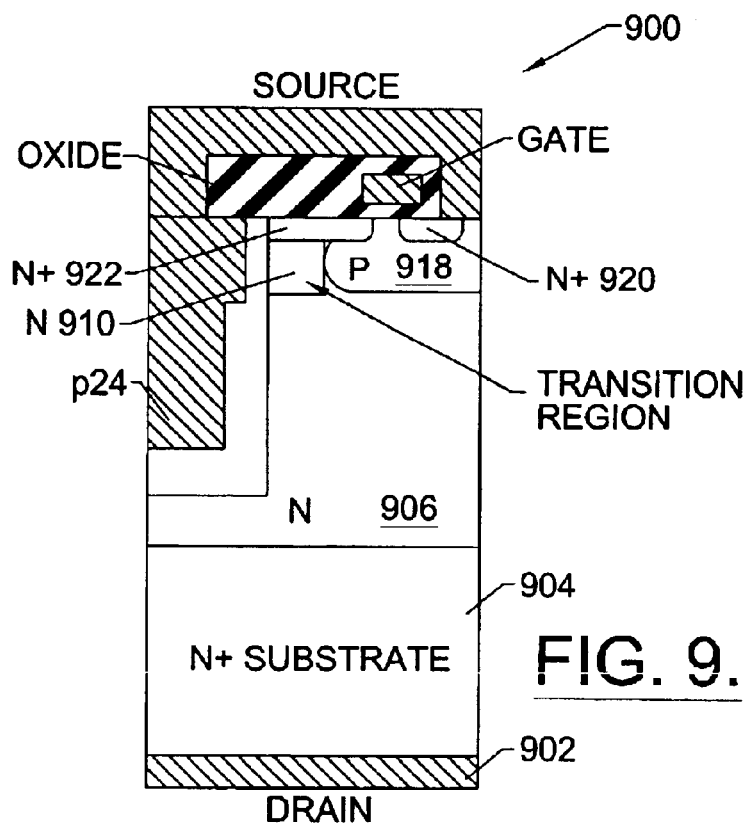
FIG. 9 is a cross-sectional view of a vertical device having a lateral MOSFET therein according to an embodiment of the present invention.

Referring now to FIG. 9, another preferred vertical device 900 having a lateral MOSFET therein will be described. This device 900 is similar to the device of FIG. 3G, however, a portion of the trench oxide extending between the source electrode 924 in the trench and the transition region 910 is thinned in order to increase the degree of coupling between the buried source electrode 924 and the transition region 910. As illustrated by FIG. 9, the device 900 includes an N+ substrate layer 904 (e.g., drain contact layer), a drain electrode 902 and a drift region 906 which may have a graded doping profile therein. A P-type base region 918 is also provided, as illustrated. A source region 920 and a channel region extension 922 (shown as N+) may also be provided. The source region and channel region extension 922 may be self-aligned to the gate electrode (GATE) using conventional CMOS fabrication techniques.

Figure 10:
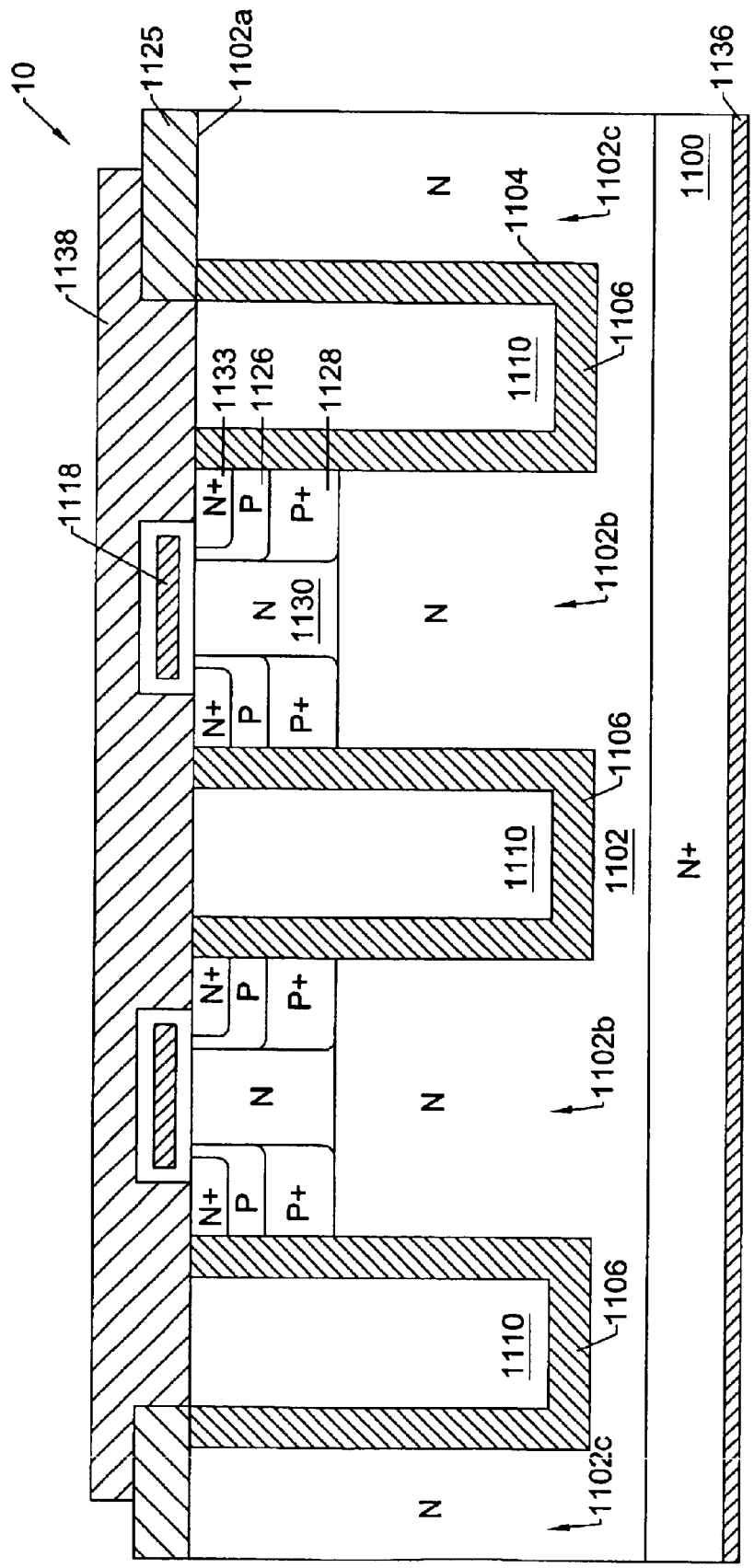
FIG. 10 is a cross-sectional view of a vertical power device according to an embodiment of the present invention.

Referring now to FIG. 10, an integrated vertical power device 10 according to a further embodiment of the present invention includes a plurality of active vertical power device unit cells located side-by-side in a semiconductor substrate. As illustrated, the power device 10 includes a highly doped drain contact region 1100 of first conductivity type (shown as N+) and a drift region 1102 of first conductivity type that forms a non-rectifying junction with the drain contact region 1100. A drain electrode 1136 is also provided in ohmic contact with the drain contact region 1100. The drain contact region 1100 may have a thickness in a range between about 10 microns and about 500 microns. The drift region 1102 is preferably nonuniformly doped. In particular, the drift region 1102 preferably has a graded doping profile which decreases monotonically in a direction extending from the non-rectifying junction to a first surface 1102a of the drift region 1102. This graded doping profile may be a linearly graded doping profile that decreases from a preferred maximum drift region dopant concentration in a range between about $1\times10^{17}$ and about $2.5\times10^{17}$ cm$^{-3}$ to a minimum dopant concentration. Accordingly, if the drain contact region 1100 is doped at a level of about $1\times10^{19}$ cm$^{-3}$ or greater, then the non-rectifying junction will be an abrupt non-rectifying junction. An upper portion of the drift region 1102 may be uniformly doped at a level of about $1\times10^{16}$ cm$^{-3}$ and the uniformly doped upper portion of the drift region 1102 may have a thickness in a range between about 0.5 and about 1.0 μm.

A plurality of trenches 1104 may be formed in the drift region 1102. If trenches are provided, the trenches 1104 are preferably formed side-by-side in the drift region 1102 as parallel stripe-shaped trenches, however, other less preferred trench shapes (e.g., ring-shaped) may also be used. As described herein, regions will be defined as separate regions if they appear as such when viewed in transverse cross-section. Each pair of trenches preferably defines a drift region mesa 1102b therebetween, as illustrated. An electrically insulating layer 1106 is also provided on the sidewalls and bottoms of the trenches 1104. The "trench" insulating layer 1106 may have a thickness of about 3000 Å, however, the thickness may vary depending, among other things, on the rating of the power device 10. The electrically insulating layer 1106 may include silicon dioxide or another conventional dielectric material. Each of the trenches 1104 is preferably filled with a conductive region 1110 that is electrically insulated from the drift region 1102 by a respective electrically insulating layer 1106. The conductive regions 1110 may constitute trench-based electrodes that are electrically connected together by a source electrode 1138. This source contact/electrode 1138 may extend on the first surface 1102a of the drift region 1102, as illustrated.

Figure 17A:
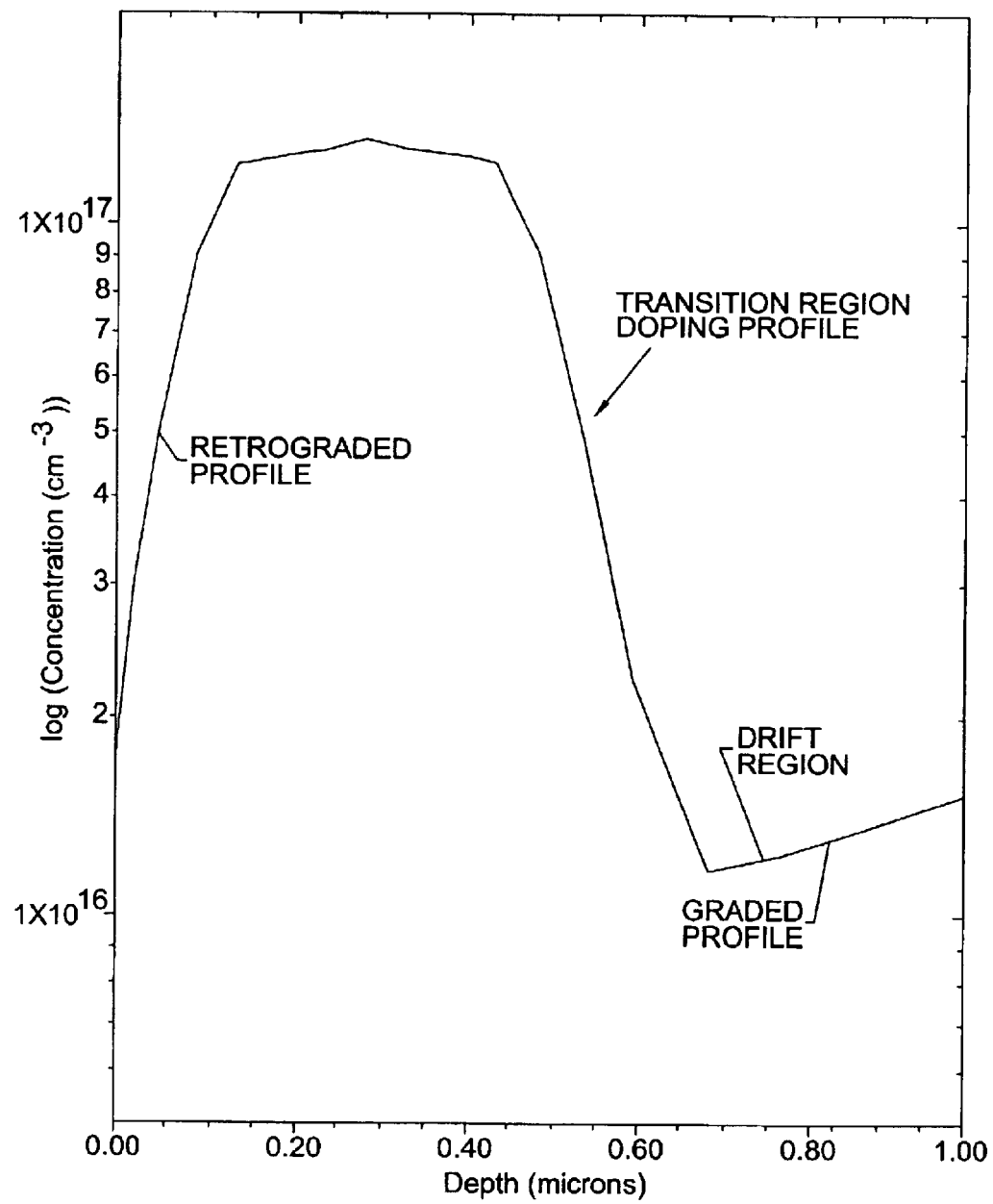
FIG. 17A is a graphical illustration of a preferred vertically retrograded doping profile across the transition region illustrated by FIG. 10, which can be obtained by performing multiple implants of transition region dopants at respective different energies.

Upper uniformly doped portions of the drift region mesas 1102b preferably include respective transition regions 1130 of first conductivity type. The transition regions 1130 form respective non-rectifying junctions with the drift region 1102 and, depending on thickness, may form respective non-rectifying junctions with the uniformly doped upper portions of the drift region 1102 or the graded doped portions of the drift region 1102. For example, the uniformly doped upper portions of the drift region 1102 may have a thickness of about 1.0 μm relative to the first surface 1102a and the transition regions 1130 may have thicknesses of about 0.7 μm relative to the first surface 1102a. Moreover, according to a preferred aspect of the present invention, each transition region 1130 has a first conductivity type doping profile therein that is vertically retrograded relative to the first surface 1102a. In particular, a peak first conductivity type dopant concentration at a first depth in the transition region is at least two (2) times greater than a value of the retrograded first conductivity type doping profile at the first surface 1102a. More preferably, the peak first conductivity type dopant concentration in the transition region is at least about ten (10) times greater than the value of the first conductivity type dopant concentration at the first surface. According to another preferred aspect, a slope of at least a portion of the retrograded first conductivity type doping profile is greater than about $3\times10^{21}$ cm$^{-4}$. The doping profile in the transition region 1130 also includes a high-to-low graded profile in a direction extending downward from the peak to the non-rectifying junction between the transition region 1130 and the drift region 1102. A desired doping profile may be achieved by performing a single transition region implant step at relatively high energy and dose or performing multiple implant steps. For example, as illustrated by FIG. 17A, a relatively wide peak in the transition region doping profile may be achieved by performing three implant steps at respective energies (and same or similar dose levels) to achieve first, second and third implant depths of about 0.15, 0.3 and 0.45 microns, using a dopant having a characteristic diffusion length of about 0.1 microns.

Gate electrodes 1118 are provided on the first surface 1102a, as illustrated. These gate electrodes 1118 may be stripe-shaped and may extend parallel to the trench-based electrodes 1110. As illustrated, the gate electrodes 1118 preferably constitute insulated gate electrodes (e.g., MOS gate electrodes). The vertical power device 10 also includes highly doped shielding regions 1128 of second conductivity type (shown as P+) that are formed at spaced locations in the drift region mesas 1102b. These shielding regions 1128 are preferably self-aligned to the gate electrodes 1118. Each of the shielding regions 1128 preferably forms a P-N rectifying junction with a respective side of the transition region 1130 and with a respective drift region mesa 1102b (or tail of the transition region 1130). According to a preferred aspect of the present invention, the peak second conductivity type dopant concentration in each shielding region 1128 is formed at about the same depth (relative to the first surface 1102a) as the peak first conductivity type dopant concentration in a respective transition region 1130. Base regions 1126 of second conductivity type (shown as P) are also formed in respective drift region mesas 1102b. Each base region 1126 is preferably self-aligned to a respective gate electrode 1118. Highly doped source regions 1133 of first conductivity type (shown as N+) are also formed in respective base regions 1126, as illustrated. The spacing along the first surface 1102a between a source region 1133 and a respective edge of the transition region 1130 defines the channel length of the power device 10. These source regions 1133 ohmically contact the source electrode 1138. Edge termination may also be provided by extending the source electrode 1138 over peripheral drift region extensions 1102c and by electrically isolating the source electrode 1138 from the peripheral drift region extensions 1102c by a field plate insulating region 1125.

The combination within each drift region mesa 1102b of (i) a pair of spaced-apart shielding regions 1128 and (ii) a preferred transition region 1130 that extends between the shielding regions 1128 and has a vertically retrograded doping profile, can enhance the breakdown voltage characteristics of each active unit cell in the multi-celled power device 10. In particular, the shielding regions 1128 can operate to "shield" the respective base regions 1126 by significantly suppressing P-base reach-through effects when the power device 10 is blocking reverse voltages and causing reverse current to flow through the shielding regions 1128 instead of the base regions 1126. This suppression of P-base reach-through enables a reduction in the channel length of the device 10. Moreover, the preferred retrograded doping profile in the transition region 1130 enables complete or full depletion of the transition region 1130 when the power device 10 is blocking maximum reverse voltages and the drift region mesa 1102b is supporting the reverse voltage.

Full depletion of the transition region 1130 may also occur during forward on-state conduction. In particular, full depletion during forward operation preferably occurs before the voltage in the channel (at the end adjacent the transition region 1130) equals the gate voltage on the insulated gate electrode 1118. As used herein, the reference to the transition region being "fully depleted" should be interpreted to mean that the transition region is at least sufficiently depleted to provide a JFET-style pinch-off of a forward on-state current path that extends vertically through the transition region 1130. To achieve full depletion, the relatively highly doped shielding regions 1128 of second conductivity (e.g., P+) are provided in close proximity and on opposite sides of the transition region 1130. As the voltage in the channel increases during forward on-state conduction, the transition region 1130 becomes more and more depleted until a JFET-style pinch-off occurs within the transition region 1130. This JFET-style pinch-off in the transition region 1130 can be designed to occur before the voltage at the drain-side of the channel ($V_{cd}$) equals the gate voltage (i.e., $V_{cd} \leq V_{gs}$). For example, the MOSFET may be designed so that the transition region 1130 becomes fully depleted when $0.1 \leq V_{cd} \leq 0.5$ Volts and $V_{gs} = 4.0$ Volts. Use of the preferred transition region 1130 enables the field effect transistor within the power device 10 to operate in a linear mode of operation during forward on-state conduction while a drain region of the transistor simultaneously operates in a velocity saturation mode of operation.

Figure 17B:
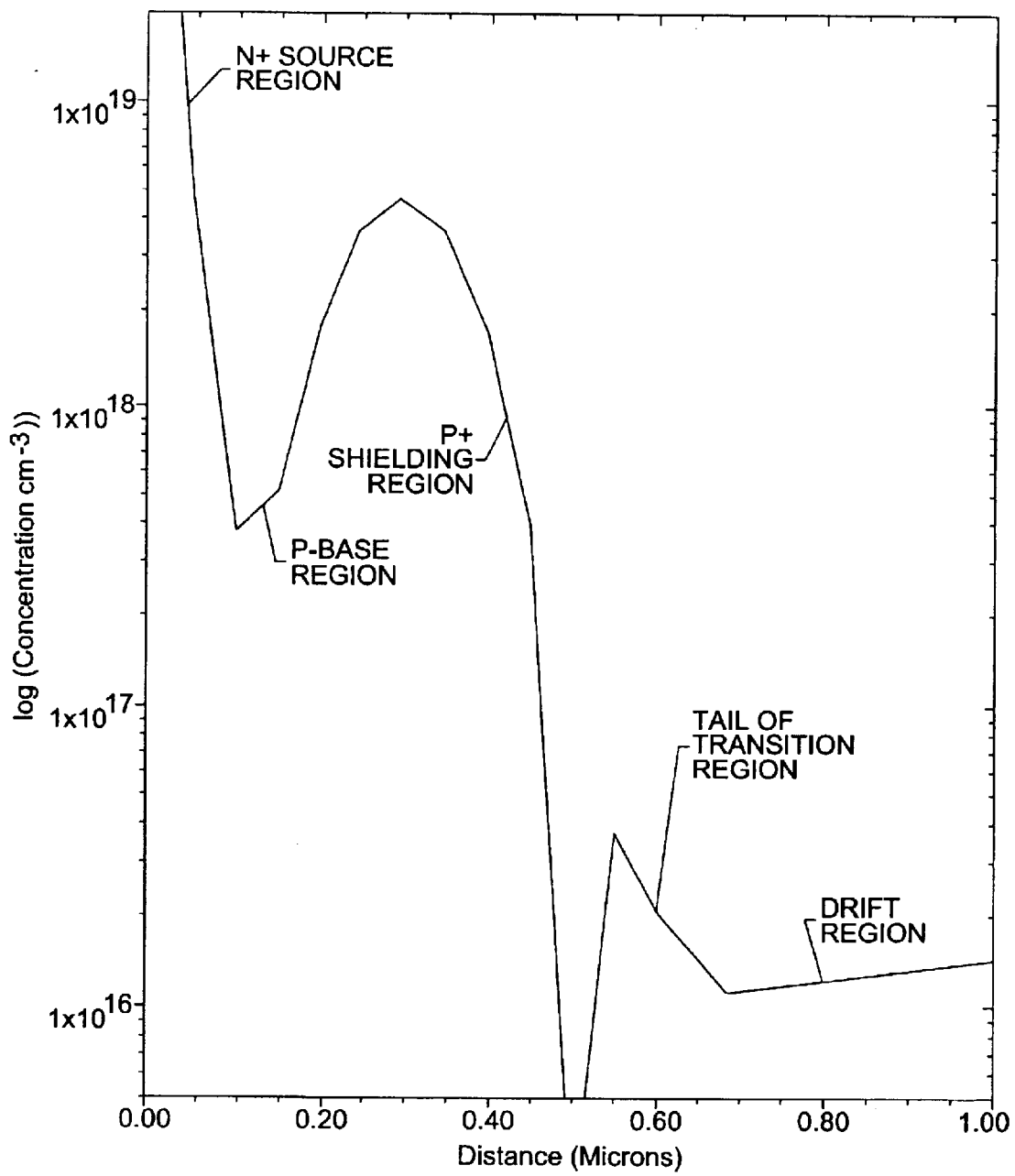
FIG. 17B is a graphical illustration of a preferred vertical doping profile across the source, base and shielding regions illustrated by FIG. 10.

Simulations of the device of FIG. 10 were also performed for a unit cell having a trench depth of 4.7 microns, a trench width of 1.1 microns and a mesa width of 1.9 microns. A sidewall oxide thickness of 3000 Å was also used. The drift region had a thickness of 6 microns and the uniformly doped upper portion of the drift region had a thickness of 0.5 microns. The concentration of first conductivity type dopants in the uniformly doped upper portion of the drift region was set at $1 \times 10^{16}$ cm$^{-3}$ and the drain contact region had a phosphorus doping concentration of $5 \times 10^{19}$ cm$^{-3}$. The gate oxide thickness was set at 250 Å and a total gate length (across the mesa) of 0.9 microns was used. The widths of the shielding, base and source regions (relative to the sidewalls) were 0.65, 0.65 and 0.45 microns, respectively, and the channel length was 0.2 microns. The width of the transition region (at the depth of the peak concentration in the transition region) was set at 0.6 microns. The depths of the source, base, shielding and transition regions and their peak dopant concentrations can be obtained from the following Table 1 and FIGS. 17A–17B, where Peak $N_d$ and Peak $N_a$ are the peak donor and acceptor concentrations.

TABLE 1

| Region | Implant Energy (KeV) | Implant Dose (cm$^2$) | Dopant | Peak $N_{d,a}$ cm$^{-3}$ |
|---|---|---|---|---|
| N+ source | 40–50 | 1–5 × 10$^{15}$ | P, As | 1 × 10$^{20}$ |
| P-base | 40–50 | 1–5 × 10$^{13}$ | B | 2 × 10$^{18}$ (surface); 4 × 10$^{17}$ (channel max) |
| P+ shield | 100 | 1–5 × 10$^{14}$ | B | 5 × 10$^{18}$ |
| N-transition | 200 | 1–10 × 10$^{12}$ | P | 1.3 × 10$^{17}$ |

Based on the above characteristics and including variations of the peak dopant concentration in the transition region (Peak$_{TR}$) and width of the transition region (W$_{TR}$), the following simulated breakdown voltages of Tables 2 and 3 were obtained. Medici™ simulation software, distributed by Avant!™ Corporation, was used to perform the device simulations.

TABLE 2

| W$_{TR}$($\mu$m) | (Peak$_{TR}$)(cm$^{-3}$) | BV (Volts) | Q(#/cm$^2$) |
|---|---|---|---|
| 0.5 | 0.4 × 10$^{17}$ | 80 | 0.2 × 10$^{13}$ |
| 0.5 | 0.7 × 10$^{17}$ | 80 | 0.35 × 10$^{13}$ |
| 0.5 | 1.2 × 10$^{17}$ | 79 | 0.6 × 10$^{13}$ |
| 0.5 | 1.3 × 10$^{17}$ | 78 | 0.65 × 10$^{13}$ |
| 0.5 | 1.4 × 10$^{17}$ | 62 | 0.7 × 10$^{13}$ |
| 0.5 | 1.6 × 10$^{17}$ | 35 | 0.8 × 10$^{13}$ |
| 0.5 | 1.9 × 10$^{17}$ | 20 | 0.95 × 10$^{13}$ |
| 0.5 | 2.5 × 10$^{17}$ | 9 | 1.25 × 10$^{13}$ |

TABLE 3

| W$_{TR}$($\mu$m) | (Peak$_{TR}$)(cm$^{-3}$) | BV (Volts) | Q(#/cm$^2$) |
|---|---|---|---|
| 0.3 | 1.4 × 10$^{17}$ | 80 | 0.42 × 10$^{13}$ |
| 0.4 | 1.4 × 10$^{17}$ | 80 | 0.56 × 10$^{13}$ |
| 0.5 | 1.4 × 10$^{17}$ | 62 | 0.7 × 10$^{13}$ |

TABLE 3-continued

| $W_{TR}(\mu m)$ | $(Peak_{TR})(cm^{-3})$ | BV (Volts) | $Q(\#/cm^{-2})$ |
|---|---|---|---|
| 0.6 | $1.4 \times 10^{17}$ | 37 | $0.84 \times 10^{13}$ |
| 0.7 | $1.4 \times 10^{17}$ | 24 | $0.98 \times 10^{13}$ |

As determined by the inventor herein and illustrated by the simulation results of Tables 2 and 3, power devices having high breakdown voltages can be provided by establishing a product of the peak first conductivity type dopant concentration in the transition region (at the first depth) and a width of the transition region at the first depth in a preferred range that is between about $1 \times 10^{12}$ cm$^{-2}$ and about $7 \times 10^{12}$ cm$^{-2}$ and, more preferably, in a range between about $3.5 \times 10^{12}$ cm$^{-2}$ and about $6.5 \times 10^{12}$ cm$^{-2}$. This narrower more preferred range can result in devices having high breakdown voltage and excellent on-state resistance characteristics. Depending on unit cell design within an integrated multi-celled device, the product of the peak first conductivity type dopant concentration in the transition region and a width of the non-rectifying junction between the transition region and the drift region may also be in a range between about $1 \times 10^{12}$ cm$^{-2}$ and about $7 \times 10^{12}$ cm$^{-2}$. A product of the peak first conductivity type dopant concentration in the transition region, a width of the transition region at the first depth and a width of the mesa may also be set at a level less than about $2 \times 10^{15}$ cm$^{-1}$. To achieve sufficient charge coupling in the drift region mesa, a product of the drift region mesa width and quantity of first conductivity type charge in a portion of the drift region mesa extending below the transition region is preferably in a range between about $2 \times 10^{9}$ cm$^{-1}$ and about $2 \times 10^{10}$ cm$^{-1}$.

Figure 11:
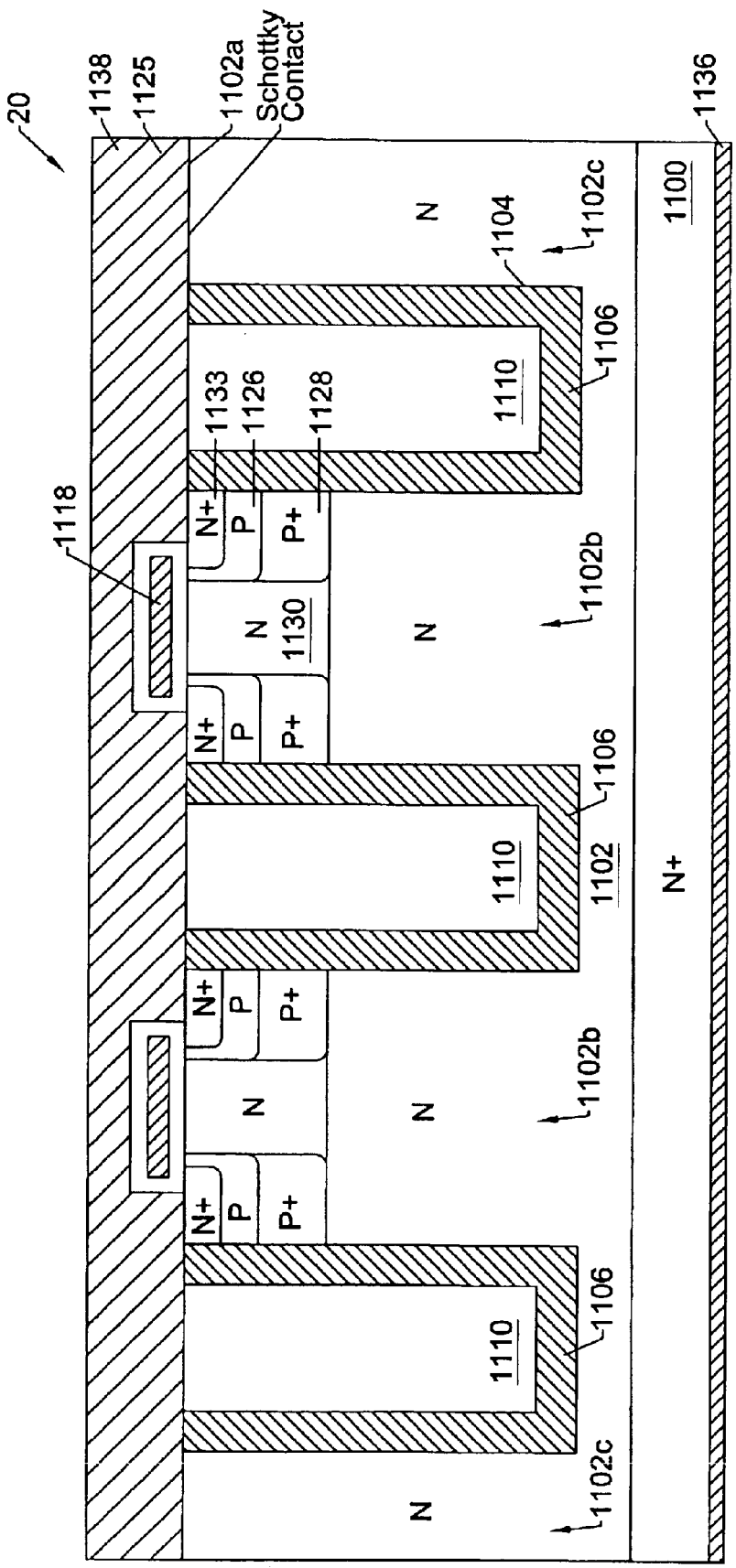
FIG. 11 is a cross-sectional view of a vertical power device according to an embodiment of the present invention.
Figure 12:
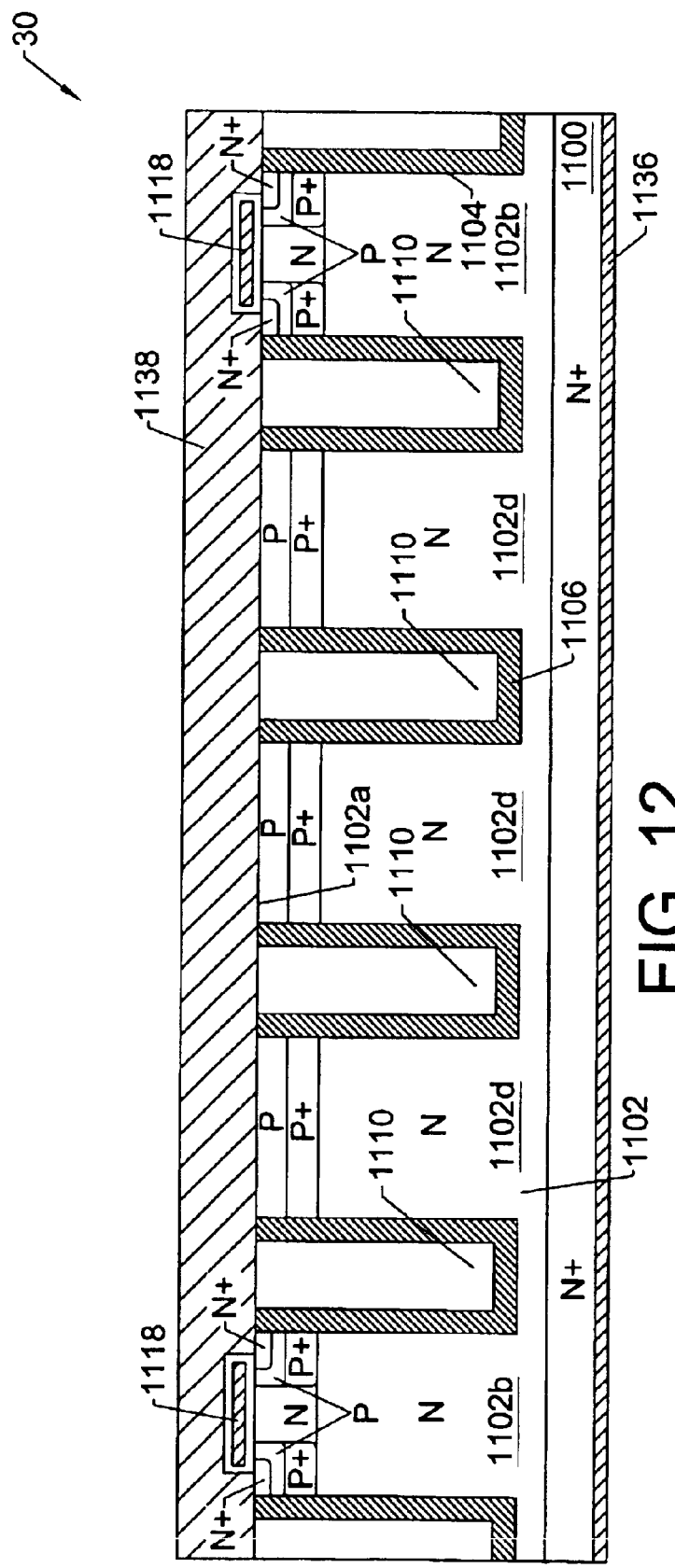
FIG. 12 is a cross-sectional view of a vertical power device according to an embodiment of the present invention.

Referring now to FIGS. 11–16, additional embodiments of power devices according to the present invention include the multi-celled power device 20 of FIG. 11. This device 20 is similar to the device 10 of FIG. 1, however, antiparallel diodes are provided by Schottky rectifying contacts that extend between the source electrode 1138 and the drift region extensions 1102c. The power device 30 of FIG. 12 is also similar to the power device 20 of FIG. 11, however, a plurality of dummy unit cells are provided in dummy drift region mesas 1102d. Dummy shielding regions (shown as P+) and dummy base regions (shown as P) are also provided in the dummy drift region mesas 1102d. As illustrated, the dummy base regions electrically contact the source electrode 1138. The dummy base regions and dummy shielding region can be formed at the same time as the base and shielding regions within the active unit cells. Depending on the thermal ratings of a multi-celled power device, one or more dummy unit cells may be provided to facilitate heat removal from each active unit cell.

Figure 13:
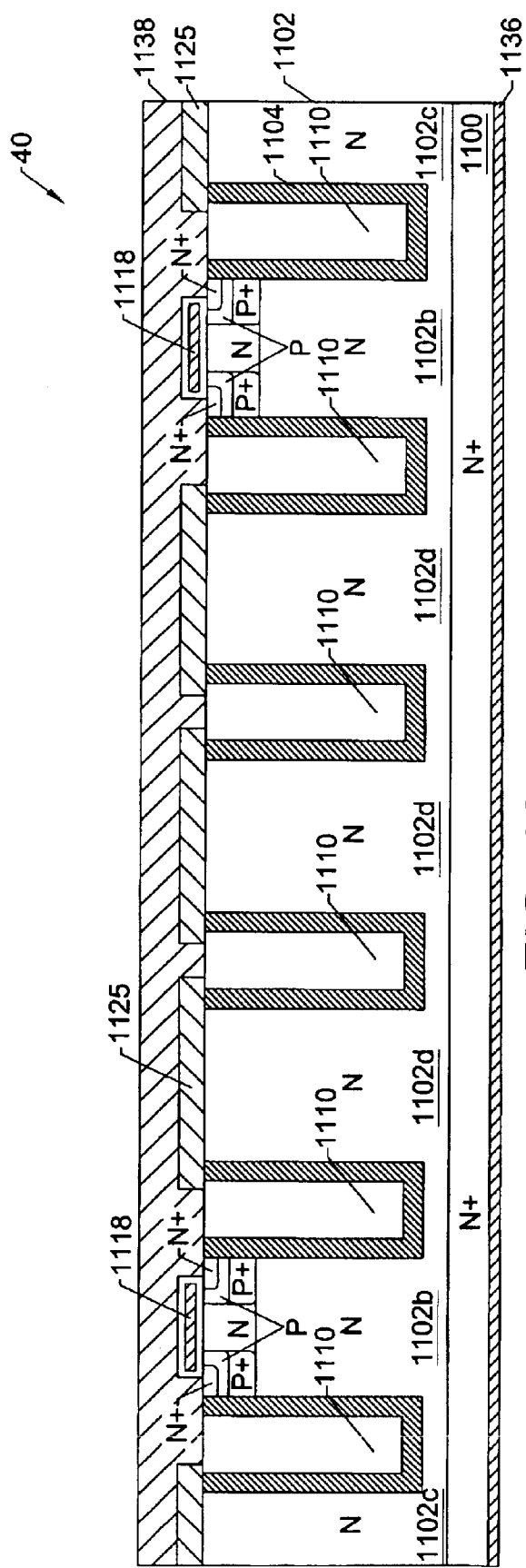
FIG. 13 is a cross-sectional view of a vertical power device according to an embodiment of the present invention.
Figure 14:
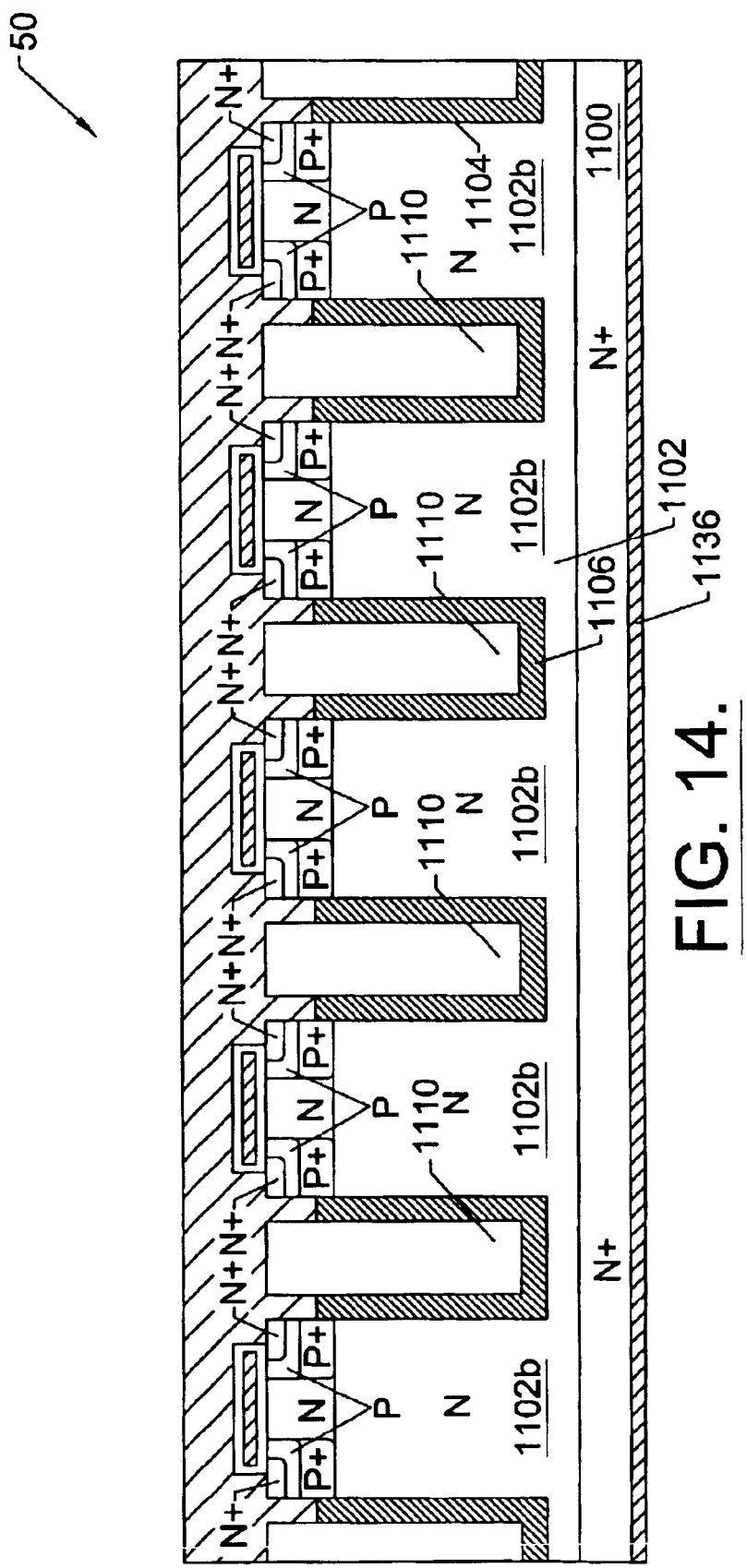
FIG. 14 is a cross-sectional view of a vertical power device according to an embodiment of the present invention.

The multi-celled power device 40 of FIG. 13 is similar to the device 30 of FIG. 3, however, the dummy drift region mesas 1102d (which may not contribute to forward on-state conduction, but preferably support equivalent reverse breakdown voltages) are capacitively coupled through a field plate insulating layer 1125 to the source electrode 1138. In contrast to the widths of the dummy drift region mesas 1102d in FIG. 12, which should be equal to the widths of the drift region mesas 1102b of the active unit cells, the widths of the dummy drift region mesas 1102d in FIG. 13 need not be equal. The power device 50 of FIG. 14 is similar to the device 20 of FIG. 11, however, the electrically insulating layers 1106 on the sidewalls of the trenches have been recessed to enable direct sidewall contact between the source electrode 1138 and the source, base and shielding regions within the active unit cells. The establishment of this direct sidewall contact increases the active area of the device 50 by reducing and preferably eliminating the requirement that the source regions be periodically interrupted in a third dimension (not shown) in order to provide direct contacts to the base regions.

Figure 15:
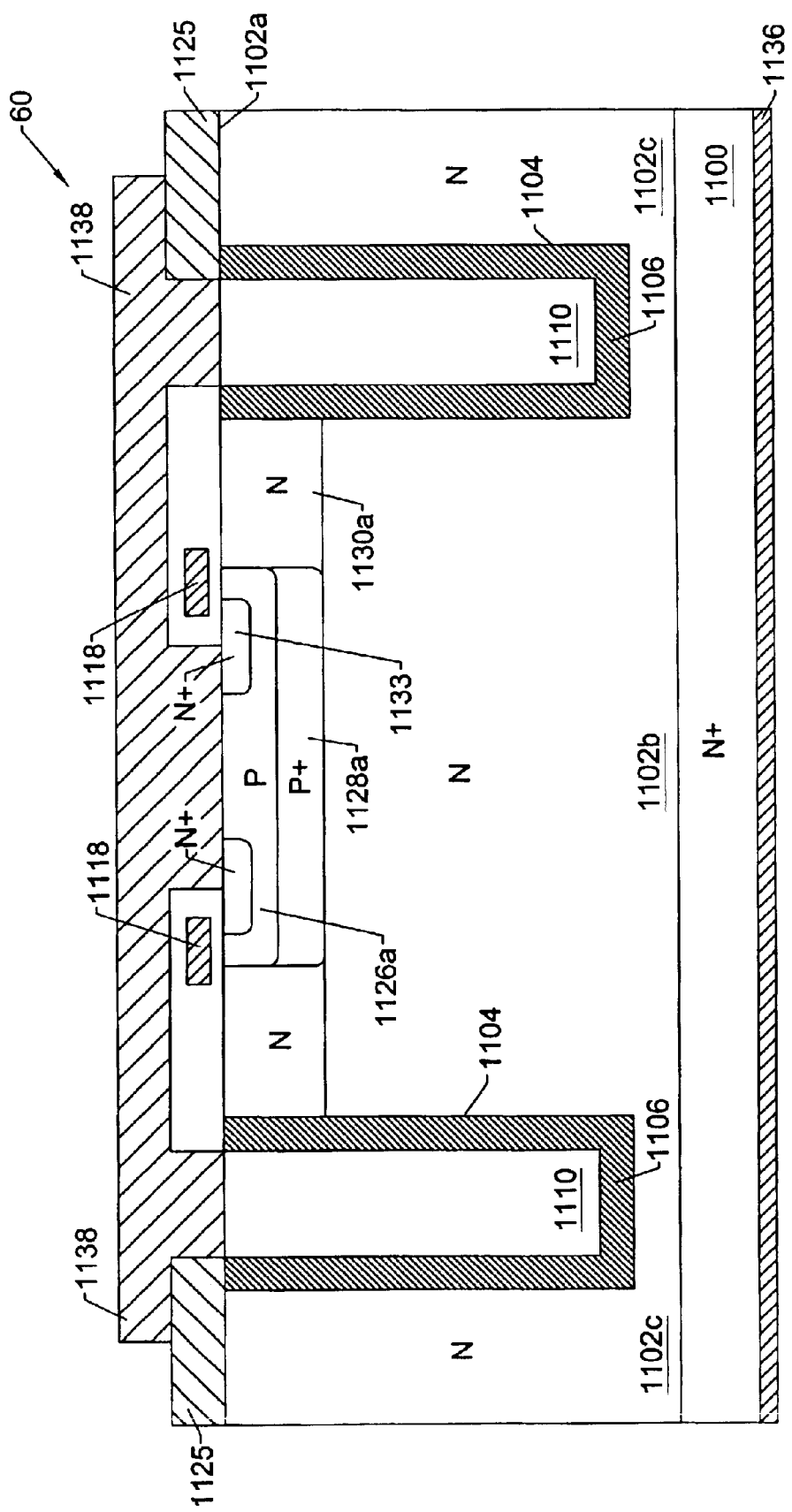
FIG. 15 is a cross-sectional view of a vertical power device according to an embodiment of the present invention.
Figure 16:
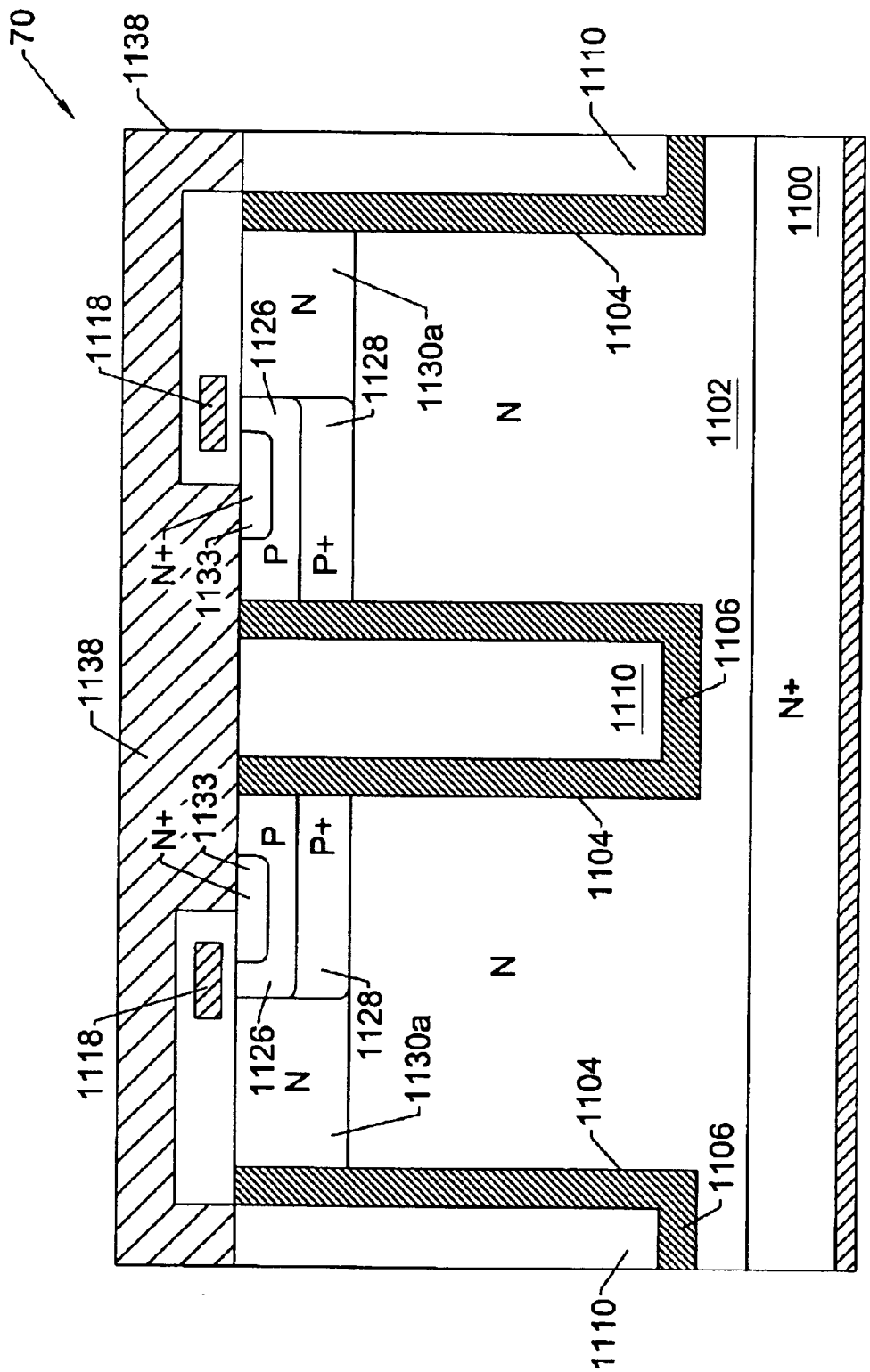
FIG. 16 is a cross-sectional view of a vertical power device according to an embodiment of the present invention.
Figure 19:
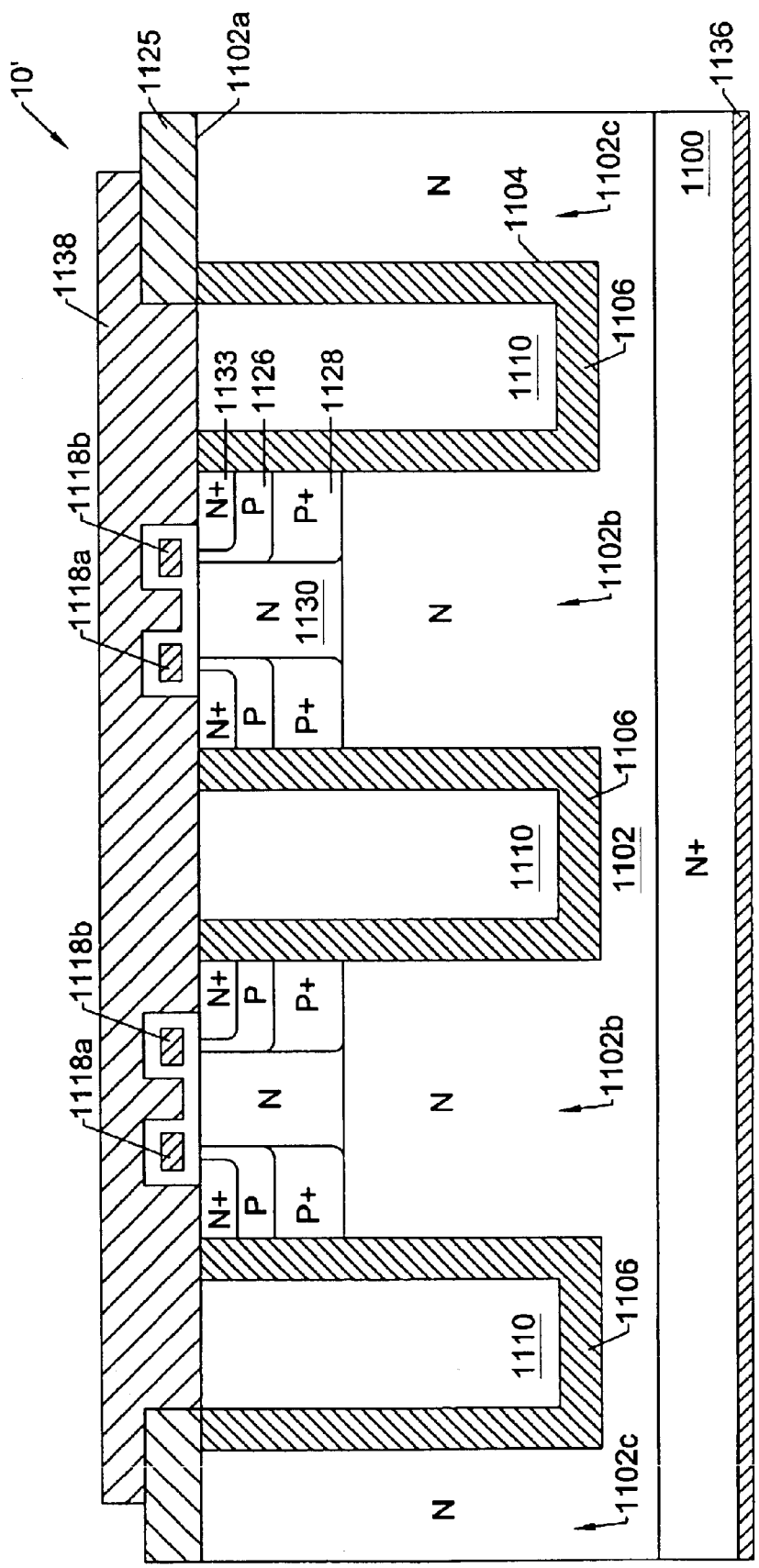
FIG. 19 is a cross-sectional view of a vertical power device according to another embodiment of the present invention.
Figure 20:
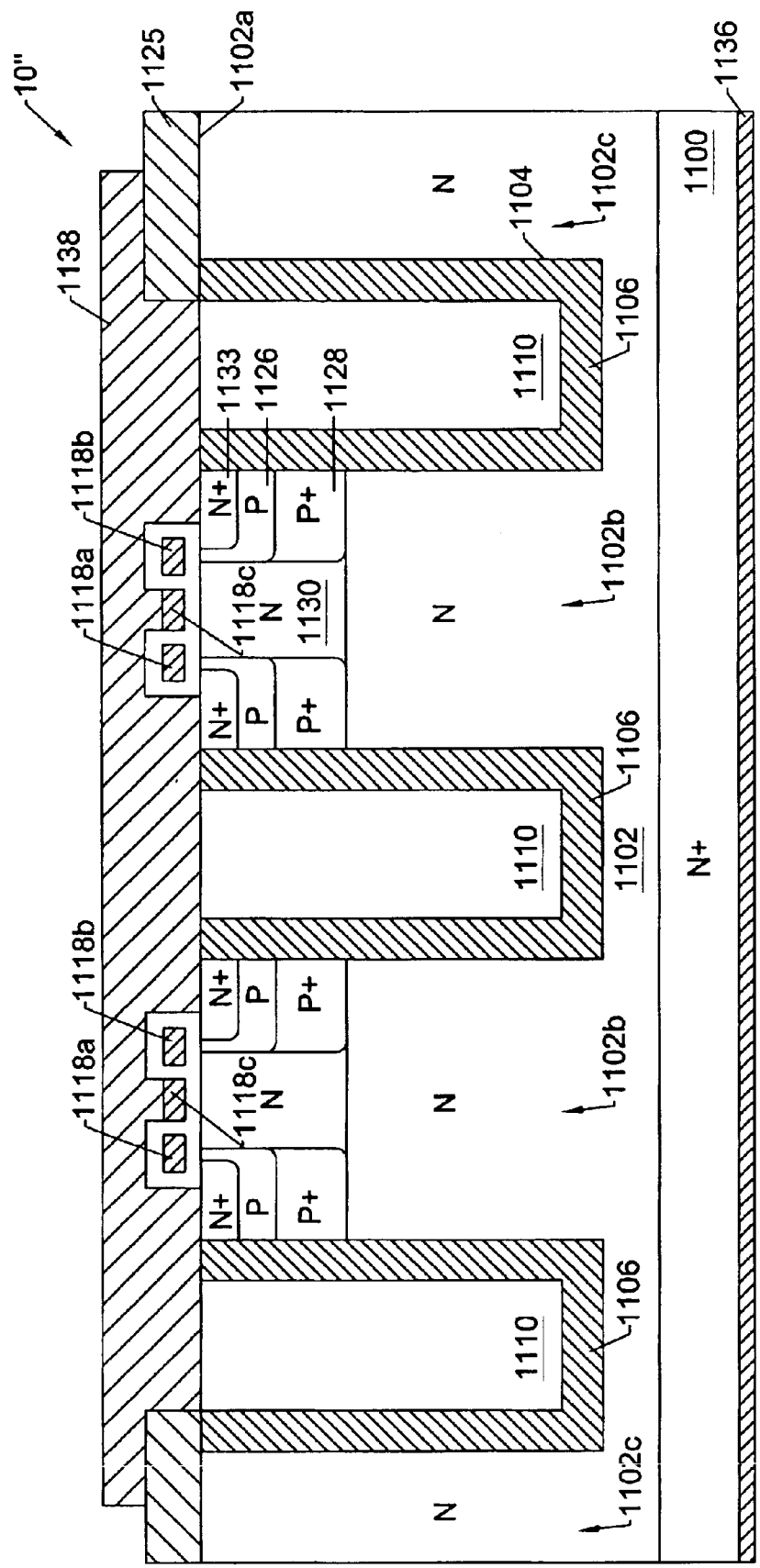
FIG. 20 is a cross-sectional view of a vertical power device that includes a dummy gate electrode electrically connected to a source electrode, according to another embodiment of the present invention.

The power device 60 of FIG. 15 illustrates a relatively wide active drift region mesa 1102b with a centrally located base region 126a and shielding region 1128a. The transition region 1130a may have the same characteristics as described above with respect to the transition regions 1130 within the power devices 10–50 of FIGS. 10–14. The power device 70 of FIG. 16 is similar to the device 60 of FIG. 15, however, the centrally located base region 1126a and shielding region 1128a of FIG. 15 have been separated by a centrally located trench 1104. The power device 10' of FIG. 19 is similar to the power device 10 of FIG. 10, however, the insulated gate electrode 1118 on each active mesa 1102b has been replaced by a pair of shorter insulated gate electrodes 1118a and 1118b. For a mesa having a width of 2.6 microns, the gate electrodes 1118a and 1118b may have a length of 0.3 microns, for example. The use of a pair of shorter gate electrodes instead of a single continuous gate electrode that extends opposite the entire width of the transition region 1130 can reduce the gate-to-drain capacitance $C_{gd}$ of the device 10' and increase high frequency power gain. The source electrode 1138 also extends into the space between the gate electrodes 1118a and 1118b, as illustrated by FIG. 19. The portion of the source electrode 1138 that extends into the space between the gate electrodes 1118a and 1118b may have a length of about 0.2 microns. The insulator that extends directly between the source electrode 1138 and the transition region 1130 may be a gate oxide and may have a thickness in a range between about 100 Å and about 1000 Å. The sidewall insulator that extends between the sidewalls of the gate electrodes 1118a and 1118b and the source electrode 1138 may also have a thickness in a range between about 1000 Å and about 5000 Å, however, other sidewall insulator thicknesses may also be used. According to another aspect of this embodiment, the portion of the source electrode 1138 that extends into the space between the gate electrodes 1118a and 1118b may be formed by patterning a conductive layer (e.g., polysilicon) used to form the gate electrode 1118a and 1118b. In particular, a third "dummy" gate electrode 1118c may be patterned that extends opposite the transition region 1130. An illustration of a vertical power device 10" that utilizes a dummy gate electrode 1118c is provided by FIG. 20. The device 10" of FIG. 20 may otherwise be similar to the device 10' of FIG. 19. Electrical contact between this third dummy gate electrode 1118c and the source electrode 1138 may be made using conventional back-end processing techniques.

Figure 18A:
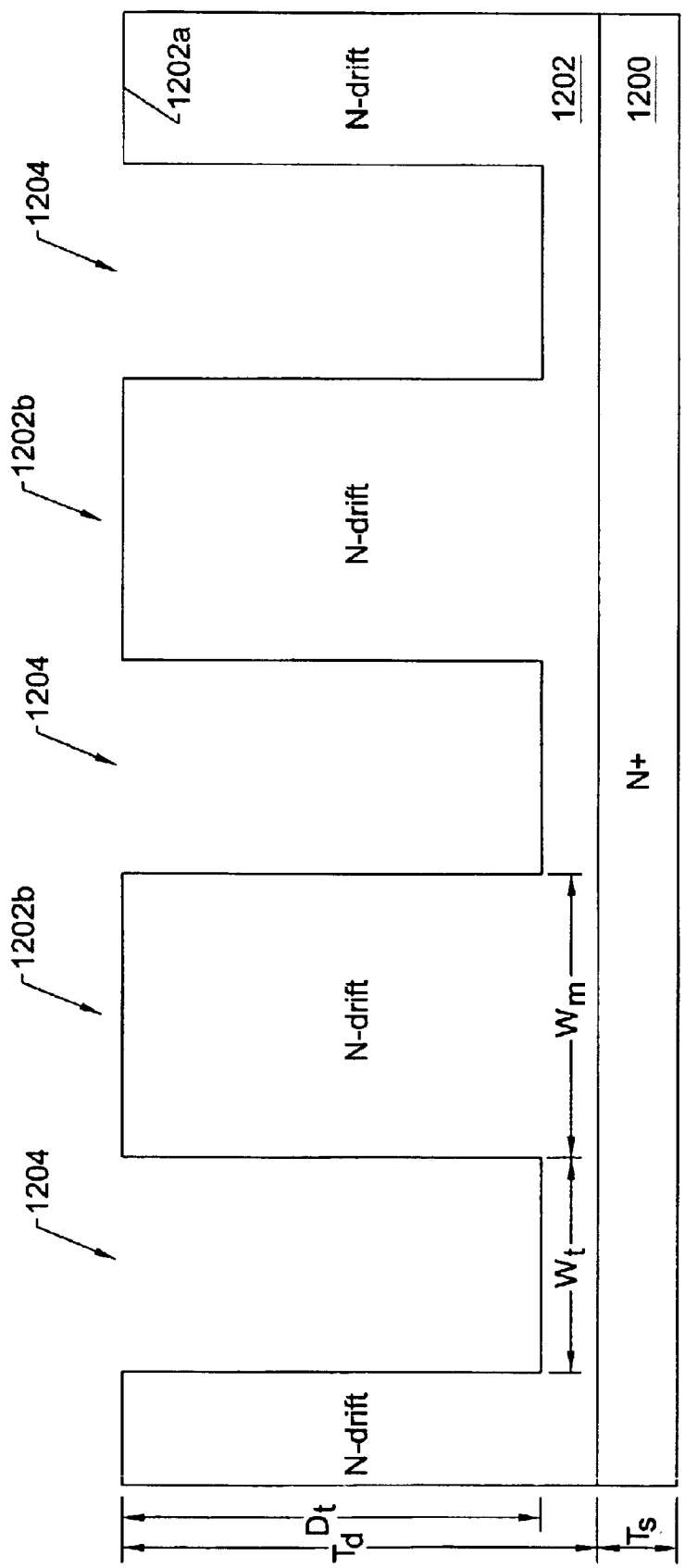
FIGS. 18A–18K are cross-sectional views of intermediate structures that illustrate preferred methods of forming the vertical power device of FIG. 14.

Preferred methods of forming the vertical power device of FIG. 14 with a 65 Volt product rating will now be described. As illustrated by FIG. 18A, these methods may include the step of epitaxially growing a drift region 1202 of first conductivity type (shown as N) on a highly doped silicon substrate 1200 (e.g., N+ substrate). This highly doped substrate 1200 may have a first conductivity type doping concentration therein of greater than about $1 \times 10^{19}$ cm$^{-3}$ and may have an initial thickness $T_s$ of about 500 microns. The epitaxial growth step is preferably performed while simultaneously doping the drift region 1202 with first conductivity type dopants in a graded manner. To achieve a 65 Volt product rating, a vertical power device having an actual blocking voltage of 75 Volts may be required. To achieve this blocking voltage, trenches having a depth in a range between about 4.5–5 microns will typically be required. To support trenches with this depth, a graded doped drift region 1202 having a thickness $T_d$ of about 6 microns may be required. Preferably, a drift region 1202 having a thickness of 6 microns will include a uniformly doped region at an upper surface thereof. This uniformly doped region may have a thickness in a range between about 0.5 and 1.0 microns and may be doped at a uniform level of about $1\times10^{16}$ cm$^{-3}$. The graded-doped portion of the drift region 1202 may have a thickness of 5.0–5.5 microns and may be graded from a doping level of $1\times10^{16}$ cm$^{-3}$ at a depth of 0.5 or 1.0 microns, for example, to a higher level of at least about $5\times10^{16}$ cm$^{-3}$ at a depth of 6.0 microns. The drift region 1202 may form an abrupt non-rectifying junction with the substrate 1200.

Figure 18B:
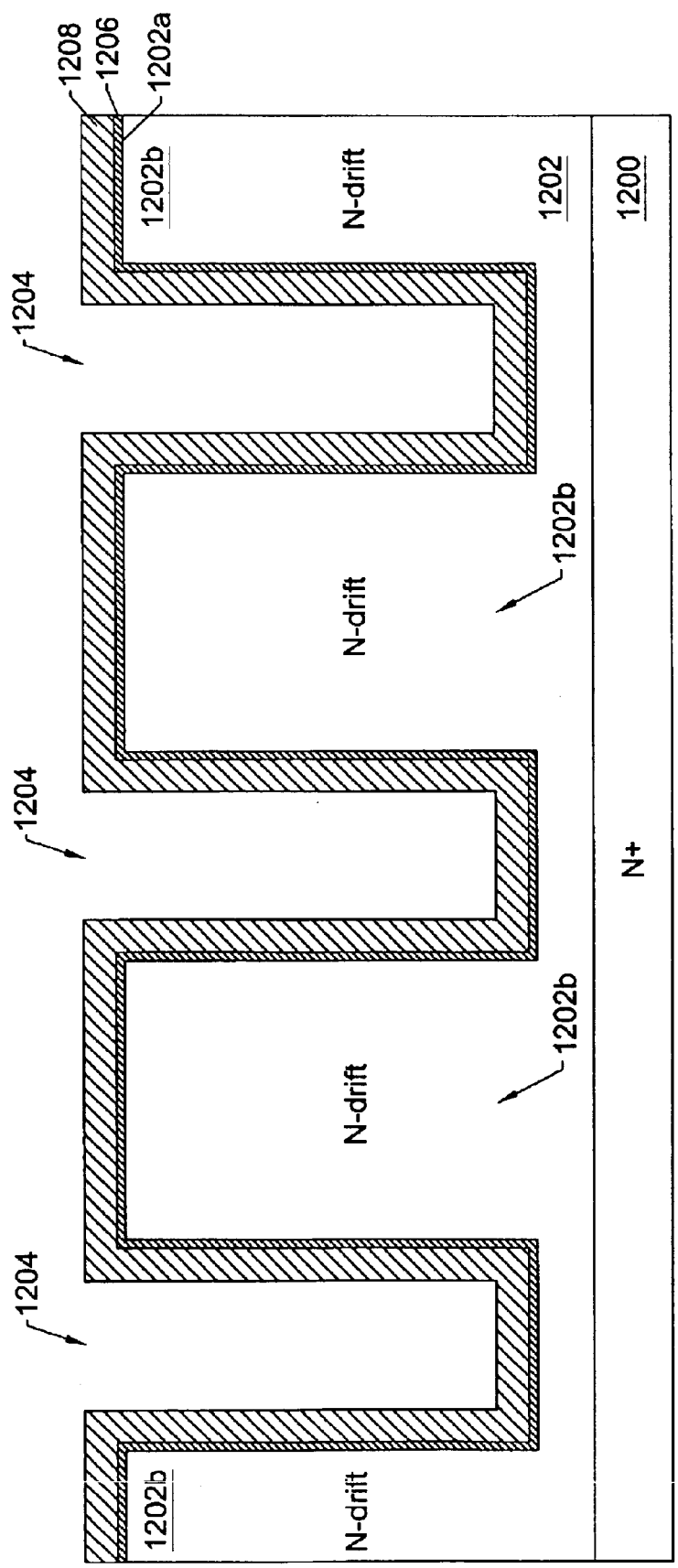

Conventional selective etching techniques may then be performed using a first etching mask (not shown) to define a plurality of parallel stripe-shaped trenches 1204 in the drift region 1202. Trenches 1204 having other shapes may also be used. For example, each pair of adjacent trenches 1204 may represent opposing sides of a respective ring-shaped trench. These trenches 1204 may have a depth $D_t$ of 5 microns, for example. Adjacent trenches 1204 define drift region mesas 1202b therebetween, with the width $W_m$ of each mesa 1202b controlled by the spacing between the adjacent trenches 1204. As illustrated by FIG. 18B, a thin thermal oxide layer 1206 may then be grown at a low temperature on the sidewalls and bottoms of the trenches 1204 and on an upper surface 1202a of each of the mesas 1202b. For example, this thin oxide layer 1206 may be grown for a duration of 30 minutes at a temperature of 900° C. in a wet O$_2$ ambient. This thermal growth step may result in an oxide layer 1206 having a thickness of about 700 Å. This thin oxide layer 1206 can be used to improve the interface between the sidewalls of the trenches 1204 and subsequently formed regions within the trenches 1204, by removing etching related defects. The thermal budget associated with this thermal oxide growth step should be insufficient to significantly alter the graded doping profile in the drift region 1202, however, the doping concentration at the surface 1202a of each mesa 1202b may increase as a result of dopant segregation. A thick conformal oxide layer 1208 may then be deposited at a low temperature to produce an electrically insulating spacer on the sidewalls and bottoms of the trenches 1204. For a 65 Volt product rating, the total oxide thickness (thermal oxide plus deposited oxide) may be 3000 Å.

Figure 18C:
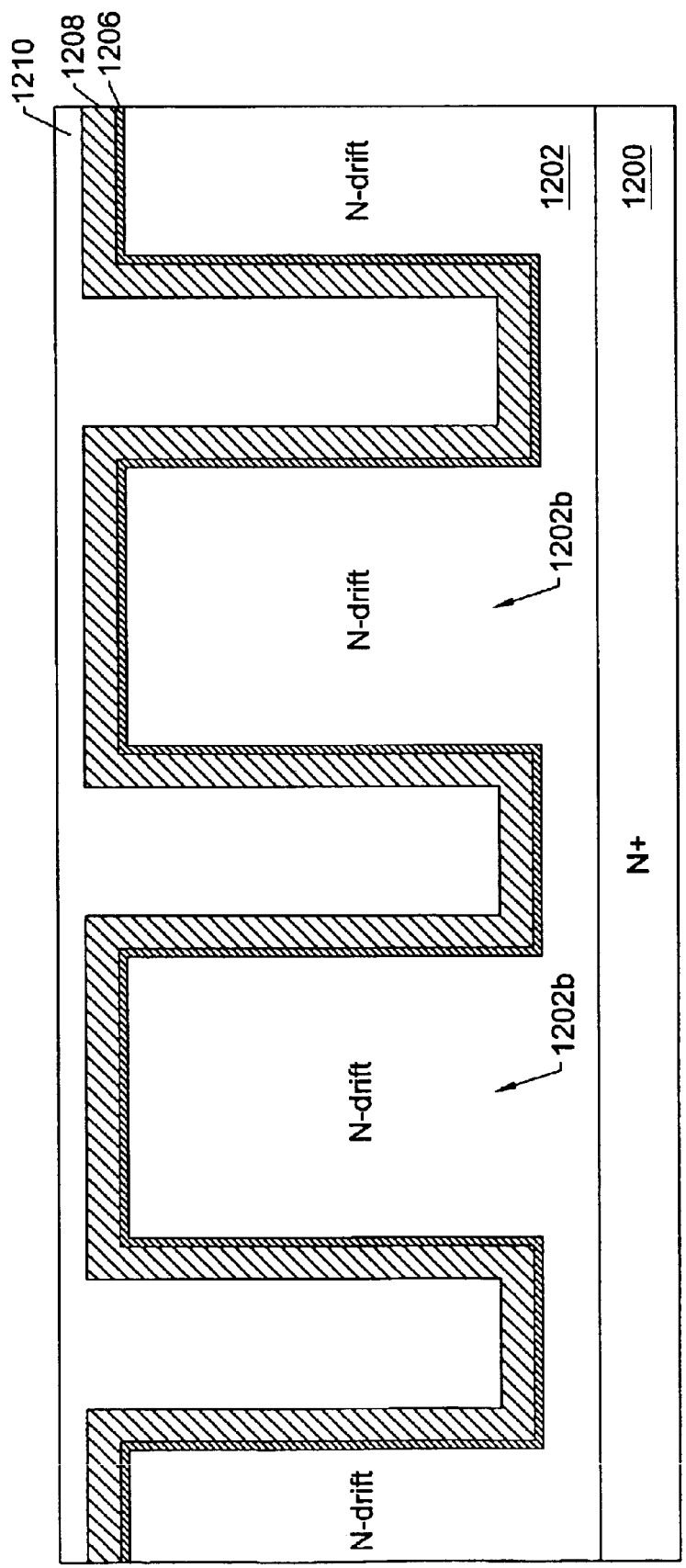
Figure 18D:
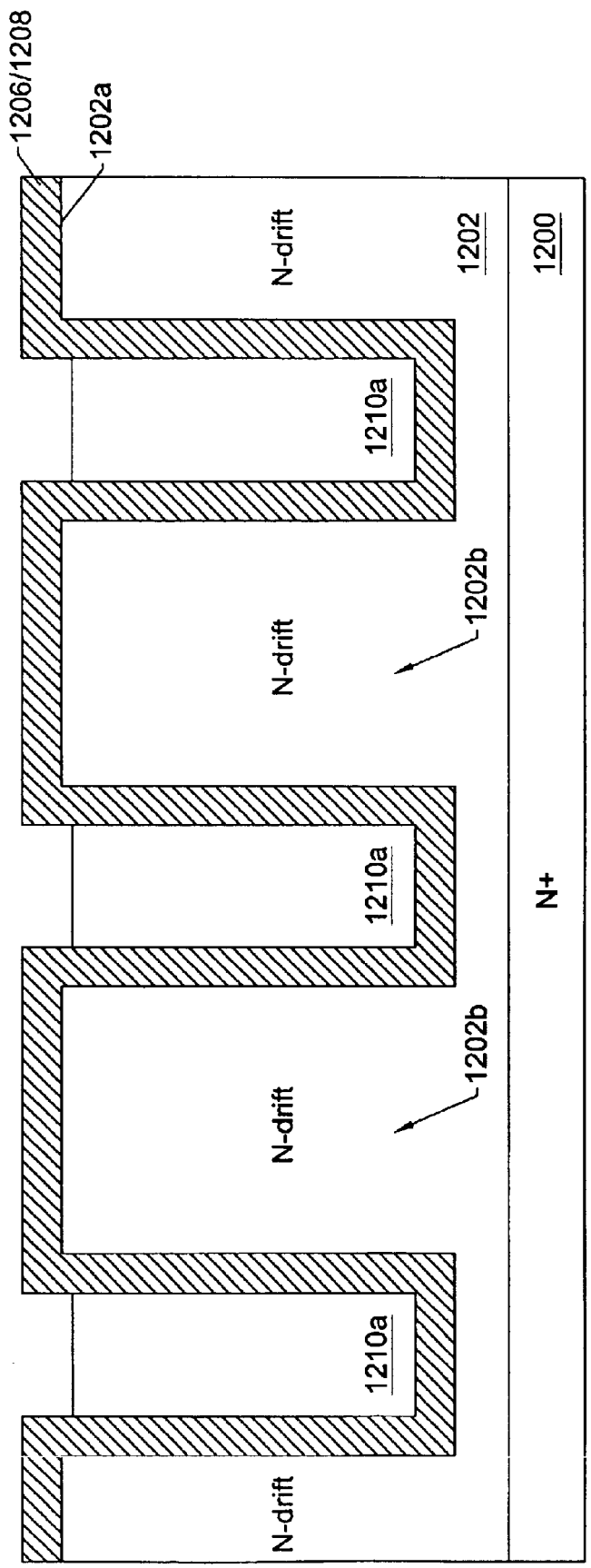
Figure 18E:
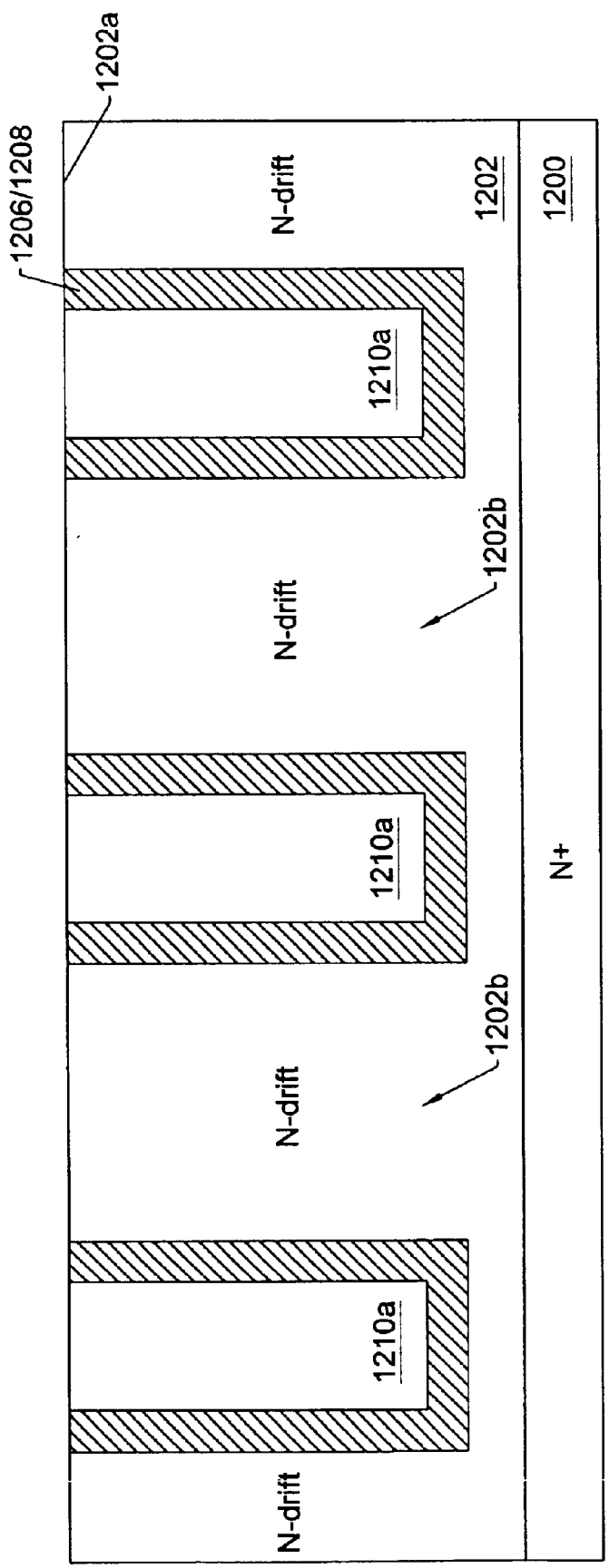

Referring now to FIG. 18C, a conformal polysilicon layer 1210 may then be deposited using a low temperature CVD process. The thickness of this layer should be sufficient to fill the trenches 1204. The polysilicon layer 1210 may be in-situ doped (e.g., with phosphorus) so that a low sheet resistance of 10 ohms/square is achieved. As illustrated by FIG. 18D, the deposited polysilicon layer 1210 may then be etched back using conventional etching techniques. The duration of this etching step may be sufficiently long that the polysilicon regions 1210a within each trench 1204 are planar with the upper surfaces 1202a of the mesas 1202b. This etch back step may be performed without an etching mask. Referring now to FIG. 18E, another etching step may then be performed with a second mask (not shown) in order to selectively remove the oxide over the mesas 1202b, but preserve the oxide within field oxide regions (not shown) that may be located around a periphery of the drift region 1202. This second mask may include a photoresist layer that has been patterned to define an etching window that is within a border of an outside trench (not shown) that surrounds an integrated power device containing a plurality of the illustrated power devices as unit cells.

Figure 18F:
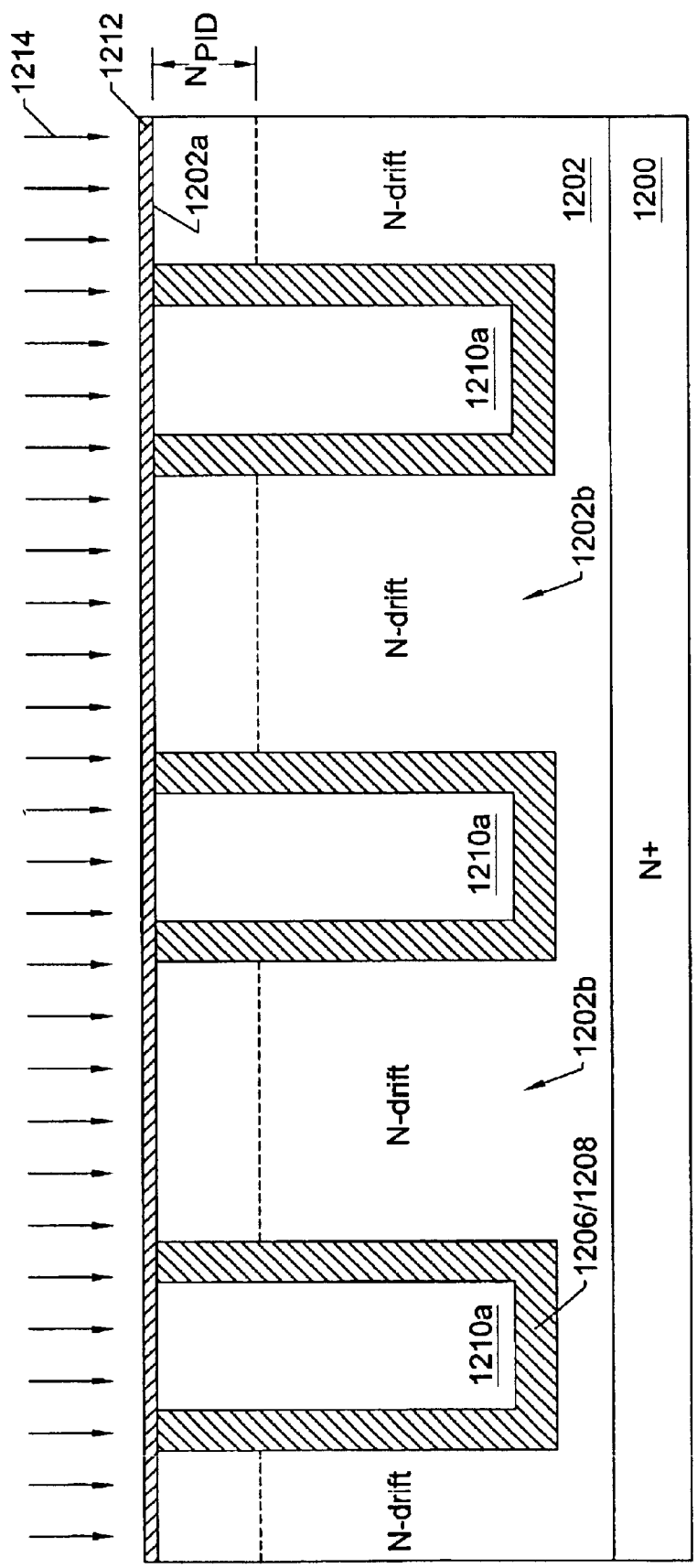

As illustrated by FIG. 18F, a thin pad oxide layer 1212 is then grown as a screening oxide over the exposed upper surfaces of the mesas 1202b. This thin pad oxide layer 1212 may have a thickness of about 250 Å. This thin pad oxide layer 1212 may be grown for a duration of 10 minutes at a temperature of 900° C. In a wet O$_2$ ambient. Transition region dopants 1214 of first conductivity type may then be implanted using a blanket implant step. In particular, transition regions having vertically retrograded doping profiles therein relative to the upper surface 1202a may be formed by implanting phosphorus dopants at an energy level of 200 keV and at a preferred dose level of $5\times10^{12}$ cm$^{-2}$. This energy level of 200 keV and dose level of $5\times10^{12}$ cm$^{-2}$ may result in an N-type transition region having a peak implant depth ($N_{PID}$) of about 0.25–0.3 microns and a peak dopant concentration of about $1.3\times10^{17}$ cm$^{-3}$. As illustrated on the left side of FIG. 17A, the N-type docant concentration in the N-type transition region may also be set to a value of less than about $2\times1016$ cm$^{-3}$ at the surface.

Figure 18G:
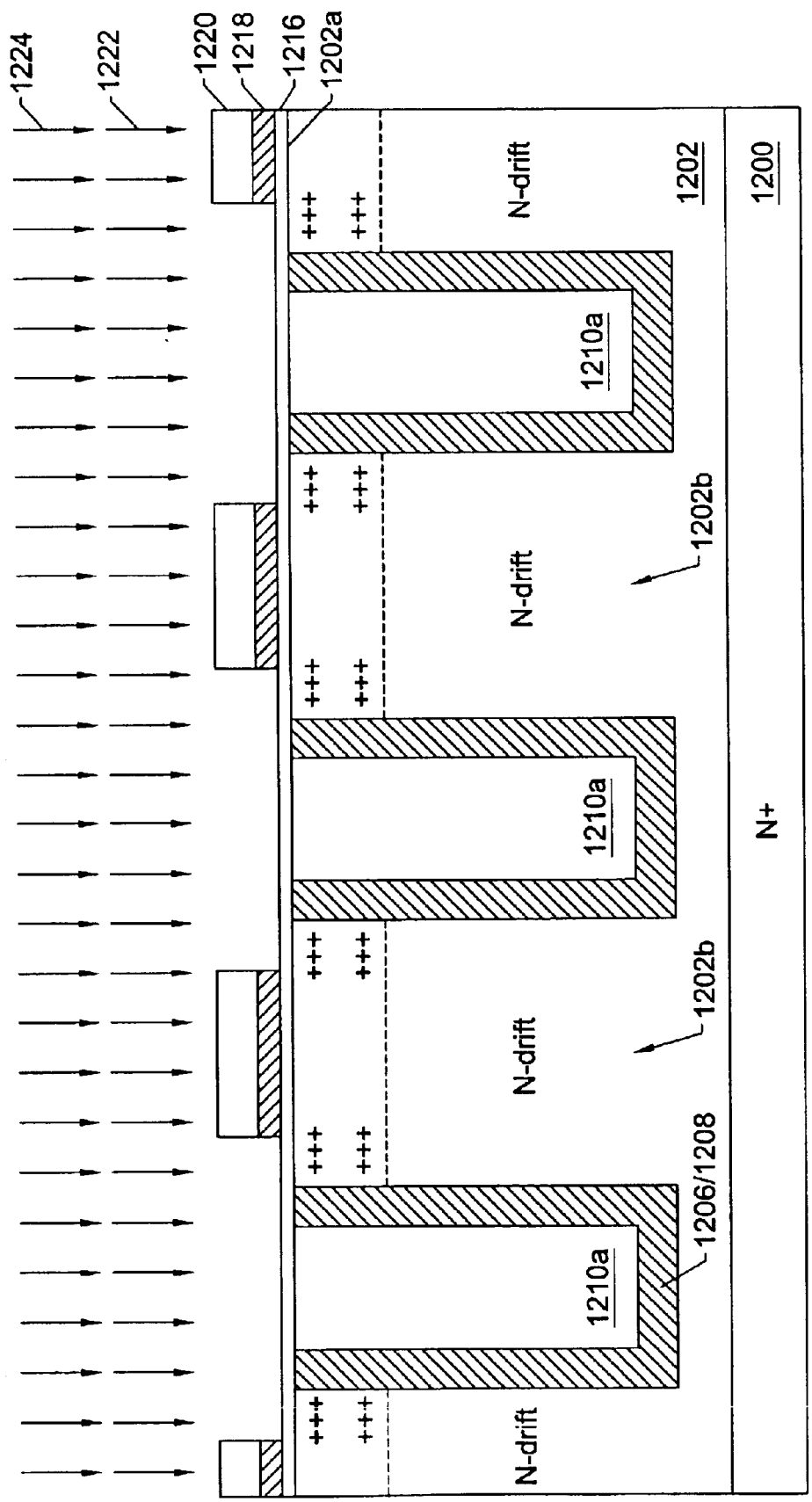

Referring now to FIG. 18G, the pad oxide layer 1212 is then removed and in its place a gate oxide layer 1216 having thickness of about 500 Å may be formed. This gate oxide layer 1216 may be provided by performing a thermal oxidation step in a wet O$_2$ ambient for a duration of 20 minutes and at a temperature of 900° C. A blanket polysilicon layer 1218 is then deposited and patterned using a photoresist mask layer 1220 (third mask), to define a plurality of gate electrodes 1218. A sequence of self-aligned implant steps are then performed. In particular, highly doped self-aligned shielding regions of second conductivity may be formed in the transition region by implanting shielding region dopants 1222 (e.g., boron) at an energy level of 100 keV and at a dose level of $1\times10^{14}$ cm$^{-2}$. After thermal treatment, these energy and dose levels may ultimately result in a shielding region having a peak boron concentration of about $5\times10^{18}$ cm$^{-3}$ at a depth of about 0.3 microns, assuming a characteristic diffusion length of about 0.1 microns. These shielding region dopants 1222 are preferably implanted using both the gate electrodes 1218 and the mask layer 1220 as an implant mask. Self-aligned base regions of second conductivity type may also be formed in the shielding regions by implanting base region dopants 1224 (e.g., boron) at an energy level of 50 keV and at a dose level of $3\times10^{13}$ cm$^{-2}$. The locations of peak concentrations of the shielding region dopants 1222 and base region dopants 1224 within the mesas 1202b, are represented by the reference characters "+". The peak concentration of the shielding region dopants may equal $3\times10^{18}$ cm$^{-3}$, at a depth of 0.25–0.3 microns. This depth preferably matches the depth of the peak of the transition region dopants.

Figure 18H:
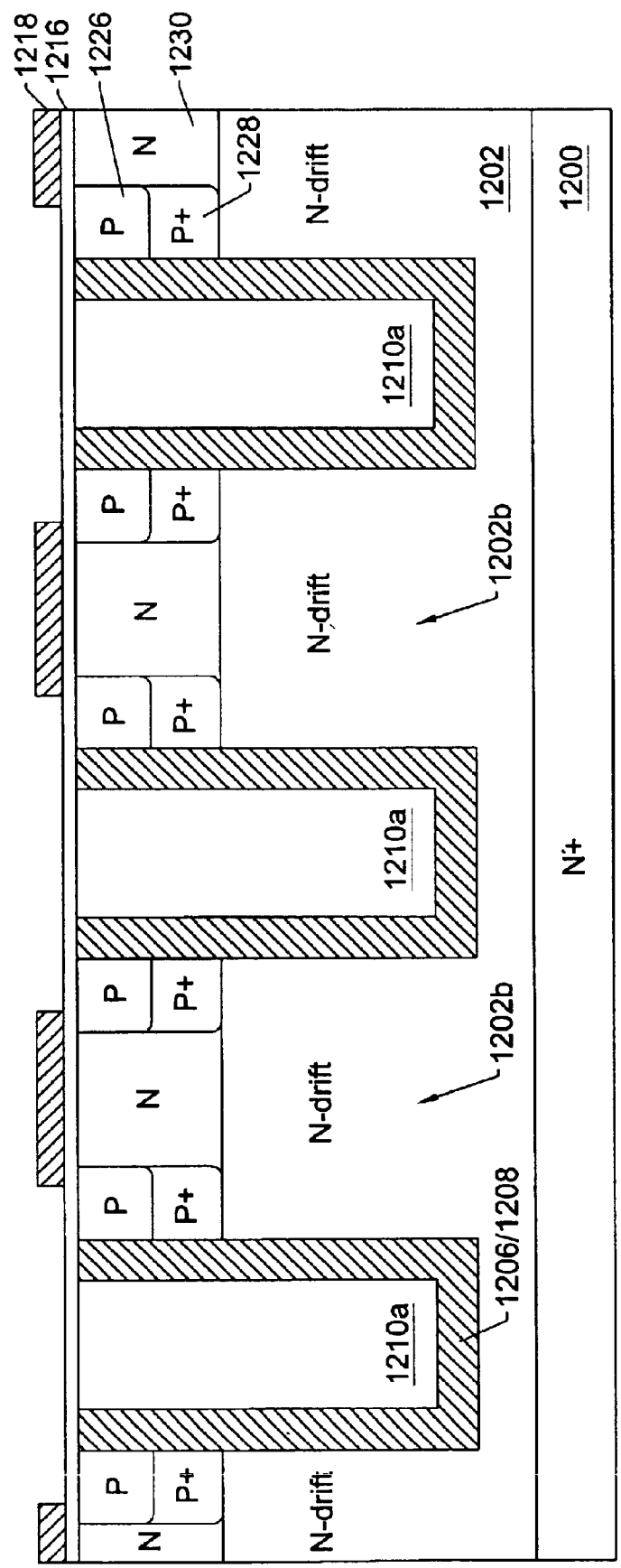

Referring now to FIG. 18H, the mask layer 1220 may be removed and then a drive-in step may be performed at a temperature of about 1000° C. and for a duration of about 60 minutes to define self-aligned base regions 1226 (shown as P), self-aligned shielding regions 1228 (shown as P+) and the transition regions 1230 (shown as N). This drive-in step, which causes lateral and downward diffusion of the implanted base, shielding and transition region dopants, may provide the highest thermal cycle in the herein described method. If the uniform and graded doping profile in the drift region is significantly altered during this step, then the initial drift region doping profile may be adjusted to account for the thermal cycle associated with the drive-in step. As illustrated by FIG. 18H, the implant energies and duration and temperature of the drive-in step may be chosen so that the depth of the P-N junction between the P+ shielding region 1228 and the drift region 1202 is about equal to the depth of the non-rectifying junction between the transition region 1230 and the drift region 1202, however, unequal depths may also be used. The depth of the P-N junction may equal 0.7 microns.

Figure 18I:
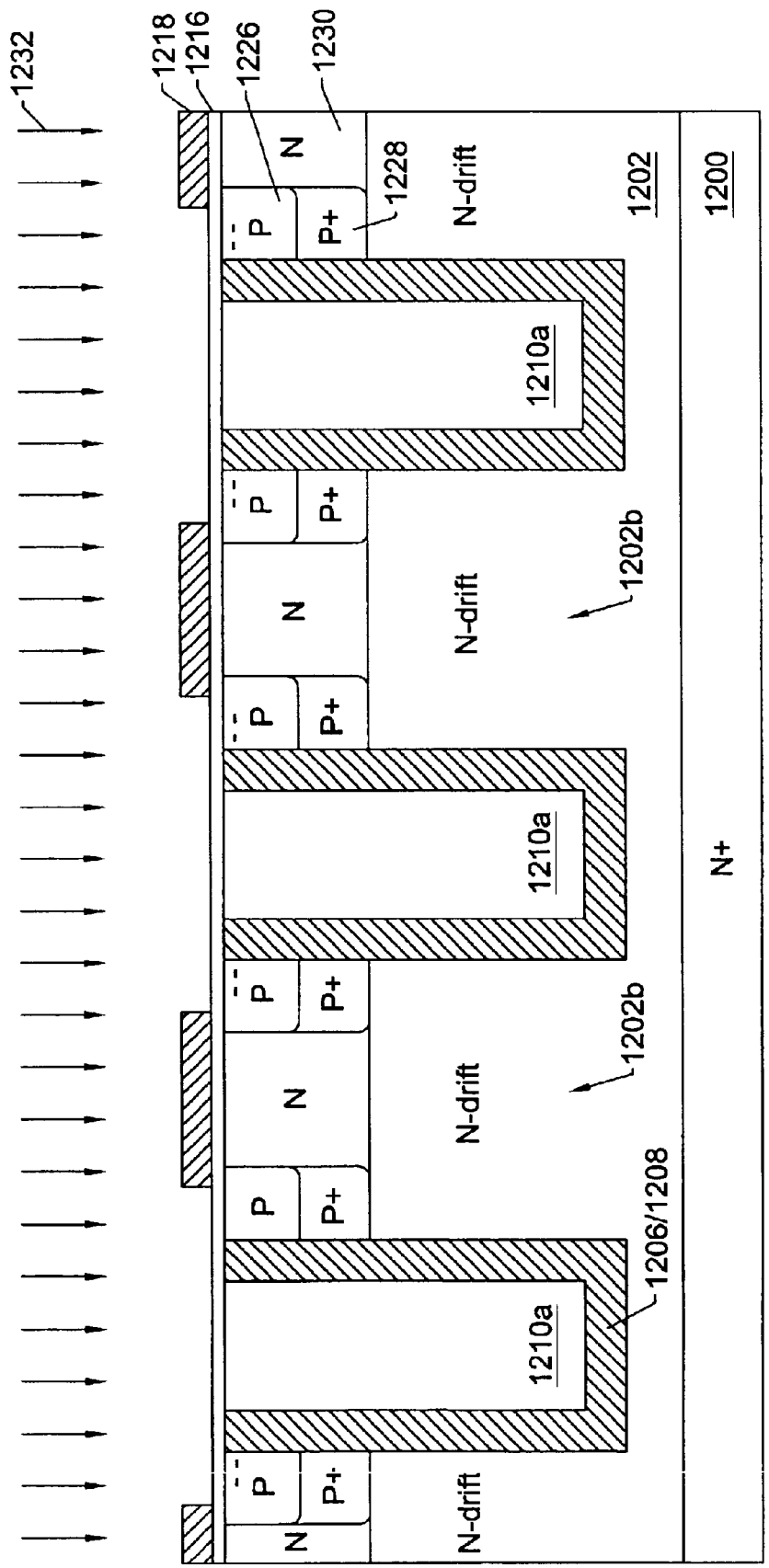
Figure 18J:
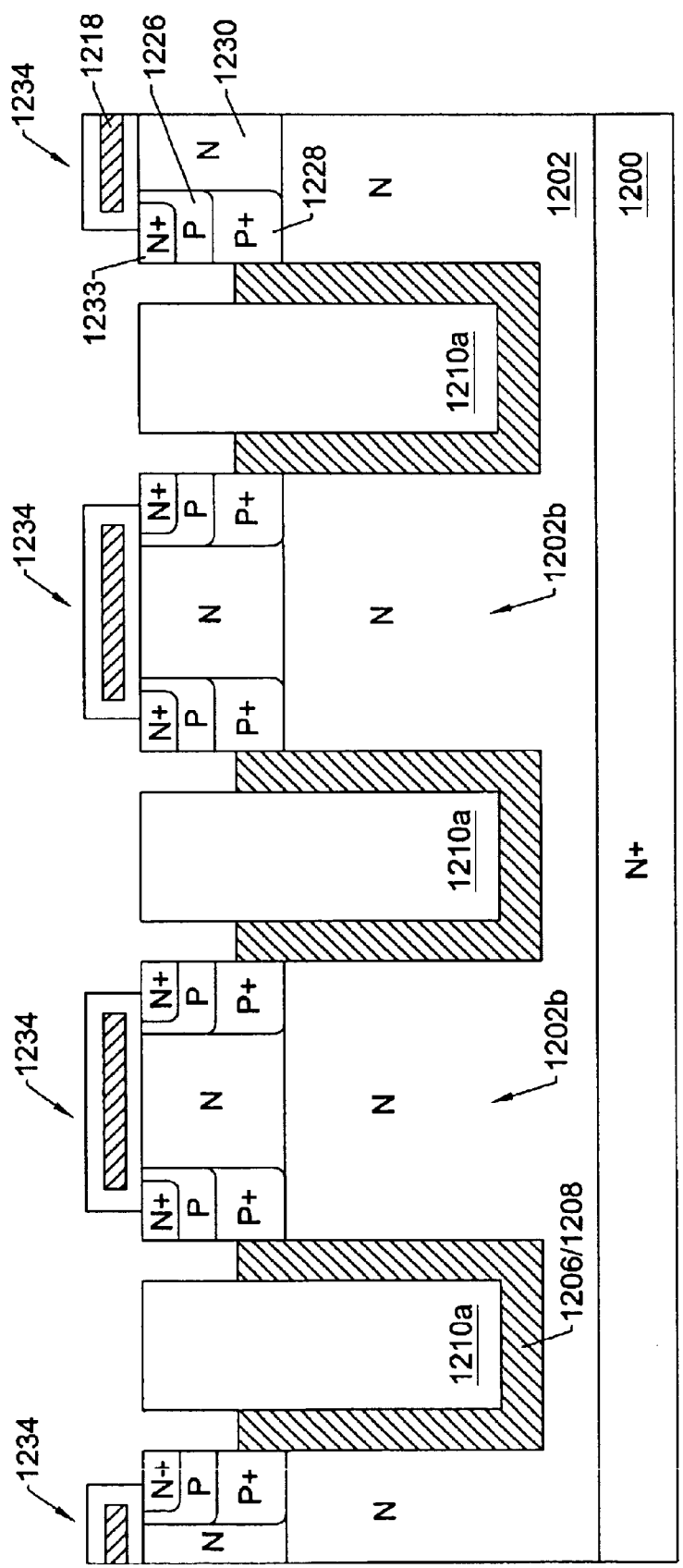
Figure 18K:
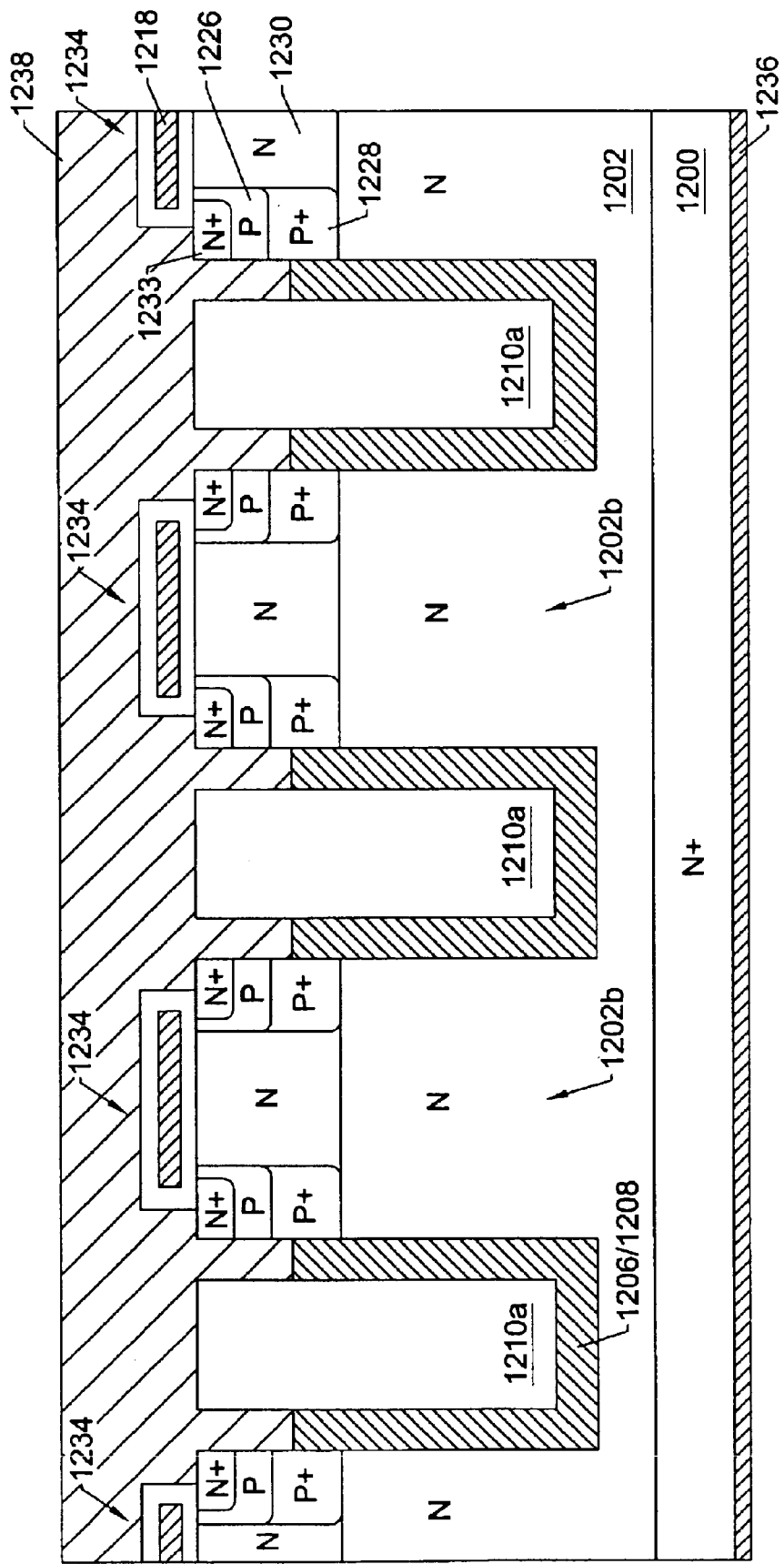

Referring now to FIG. 18I, source region dopants 1232 of first conductivity type are then implanted into the base regions 1226, using the gate electrodes 1218 as an implant mask. The source region dopants 1232 may be implanted at an energy level of 40 keV and at a dose level of $2\times10^{14}$ cm$^{-2}$. As illustrated by FIG. 18J, the implanted source region dopants (shown by reference character "−") may then be driven-in at a temperature of 900° C. and for a duration of 10 minutes, to define N+ source regions 1233. This implant step may be performed using the gate electrodes 1218 and fourth photoresist mask (not shown) as an implant mask. The fourth photoresist mask may be patterned to define the locations of shorts to the P-base region in a third dimension relative to the illustrated cross-section (not shown). Conventional insulator deposition, sidewall spacer formation and patterning steps may then be performed to define a plurality of insulated gate electrodes 1234. These steps may also be performed to define contact windows to the source regions, the P-base regions, the polysilicon in the trenches and the gate electrodes. The insulating regions 1206/1208 lining upper sidewalls of the trenches may also be selectively etched back to expose sidewalls of the source, base and shielding regions. The presence of this etch back step may eliminate the need to define shorts to the P-base region, using the fourth photoresist mask, and therefore may result in an increase in the forward on-state conduction area for a given lateral unit cell dimension. As illustrated by FIG. 18K, conventional front side metallization deposition and patterning steps may also be performed to define a source contact 1238 and gate contact (not shown). As illustrated, the source contact 1238 extends along the upper sidewalls of the trenches 1204 and contacts the exposed portions of the source, base and shielding regions. The backside of the substrate 1200 may also be thinned and then conventional backside metallization steps may be performed to define a drain contact 1236.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A vertical power device, comprising:
    a semiconductor substrate;
    a drift region of first conductivity type in said semiconductor substrate;
    first and second spaced-apart base regions of second conductivity type in said semiconductor substrate;
    first and second source regions of first conductivity type in said first and second base regions, respectively;
    a transition region of first conductivity type that extends between said first and second base regions, forms a non-rectifying junction with the drift region and has a vertically retrograded first conductivity type doping profile relative to a surface of said semiconductor substrate; and
    an insulated gate electrode that extends on the surface and opposite said first base region and said transition region.

2. The device of claim 1, wherein a peak first conductivity type dopant concentration in said transition region is at least ten times greater than a value of the retrograded first conductivity type doping profile at the surface.

3. The device of claim 1, wherein said transition region has a peak first conductivity type dopant concentration therein at a first depth relative to the surface; and wherein a product of the peak first conductivity type dopant concentration in said transition region and a width of said transition region at the first depth is in a range between $1\times10^{12}$ cm$^{-2}$ and $7\times10^{12}$ cm$^{-2}$.

4. The device of claim 3, wherein a peak first conductivity type dopant concentration in said transition region is at least ten times greater than a value of the retrograded first conductivity type doping profile at the surface.

5. The device of claim 1, wherein said transition region has a peak first conductivity type dopant concentration therein at a first depth relative to the surface; and wherein a product of the peak first conductivity type dopant concentration in said transition region and a width of said transition region at the first depth is in a range between $3.5\times10^{12}$ cm$^{-2}$ and $6.5\times10^{12}$ cm$^{2}$.

6. The power device of claim 5, wherein said insulated gate electrode, said first source region, said first base region, said transition region and said drift region collectively define an insulated-gate field effect transistor that is configured to support an inversion-layer channel in said first base region during forward on-state conduction, said inversion-layer channel being operable in a linear mode of operation while the drift region simultaneously operates in a velocity saturation mode of operation.

7. The device of claim 5, wherein a peak first conductivity type dopant concentration in said transition region is at least ten times greater than a value of the retrograded first conductivity type doping profile at the surface.

8. The device of claim 1, further comprising:
    a first shielding region of second conductivity type that extends between said first base region and the drift region and is more highly doped than said first base region; and
    a second shielding region of second conductivity type that extends between said second base region and the drift region and is more highly doped than said second base region.

9. The device of claim 8, wherein said first and second shielding regions form respective P-N rectifying junctions with said transition region; wherein said transition region has a peak first conductivity type dopant concentration therein at a first depth relative to the surface; and wherein a product of the peak first conductivity type dopant concentration in said transition region and a width between said first and second shielding regions is in a range between $1\times10^{12}$ cm$^{-2}$ and $7\times10^{12}$ cm$^{-2}$.

10. The device of claim 9, wherein the peak first conductivity type dopant concentration in said transition region is greater than about $1\times10^{17}$ cm$^{-3}$; wherein the surface defines an interface between said insulated gate electrode and said transition region; and wherein a first conductivity type dopant concentration in said transition region is less than about $2\times10^{16}$ cm$^{-3}$ at the surface.

11. The power device of claim 1, wherein said insulated gate electrode, said first source region, said first base region, said transition region and said drift region collectively define an insulated-gate field effect transistor that is configured to support an inversion-layer channel in said first base region during forward on-state conduction, said inversion-layer channel being operable in a linear mode of operation while the drift region simultaneously operates in a velocity saturation mode of operation.

* * * * *

UNITED STATES PATENT AND TRADEMARK OFFICE
CERTIFICATE OF CORRECTION

PATENT NO.    : 6,784,486 B2
DATED         : August 31, 2004
INVENTOR(S)   : Bantval Jayant Baliga It is certified that error appears in the above-identified patent and that said Letters Patent is hereby corrected as shown below:

<u>Title page,</u>
Item [56], References Cited, U.S. PATENT DOCUMENTS, please add:
-- 5,879,967    3/1999         Kim    438/133 --

<u>Column 28,</u>
Line 57, change "$cm^{F313}$ at the surface" to -- $cm^{-3}$ at the surface --.

Signed and Sealed this

Eighteenth Day of January, 2005

JON W. DUDAS
*Director of the United States Patent and Trademark Office*